(12) United States Patent
Casper et al.

(10) Patent No.: US 11,483,186 B2
(45) Date of Patent: Oct. 25, 2022

(54) ULTRA-HIGH DATA RATE DIGITAL MM-WAVE TRANSMITTER WITH ENERGY EFFICIENT SPECTRAL FILTERING

(71) Applicant: Intel Corporation, Santa Clara, CA (US)

(72) Inventors: Bryan Casper, Ridgefield, WA (US); James Jaussi, Hillsboro, OR (US); Chintan Thakkar, Portland, OR (US); Stefan Shopov, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 32 days.

(21) Appl. No.: 17/252,709

(22) PCT Filed: Sep. 19, 2018

(86) PCT No.: PCT/US2018/051667
§ 371 (c)(1),
(2) Date: Dec. 15, 2020

(87) PCT Pub. No.: WO2020/060543
PCT Pub. Date: Mar. 26, 2020

(65) Prior Publication Data
US 2021/0168000 A1    Jun. 3, 2021

(51) Int. Cl.
*H04L 25/03* (2006.01)
*H04L 27/36* (2006.01)
(Continued)

(52) U.S. Cl.
CPC ....... *H04L 25/03847* (2013.01); *H03F 3/193* (2013.01); *H03F 3/245* (2013.01);
(Continued)

(58) Field of Classification Search
CPC ...... H03M 3/50; H04L 27/367; H04L 27/361; H04L 25/03847; H03F 3/217; H03F 2200/451
See application file for complete search history.

(56) References Cited

U.S. PATENT DOCUMENTS

2012/0056676 A1\* 3/2012 Frambach ............. H03F 3/2178
330/295
2015/0349721 A1   12/2015 Samavedam et al.
(Continued)

FOREIGN PATENT DOCUMENTS

CN         112368986         2/2021

OTHER PUBLICATIONS

Yiyu Shen, Woogeun Rhee, and Zhihua Wang, "A Digital Power Amplifier with FIR-Embedded 1-Bit High-Order ΔΣ Modulation for WBAN Polar Transmitters", Tsinghua University, Beijing, China, IEEE, 2015 (Year: 2015).\*
(Continued)

*Primary Examiner* — Aristocratis Fotakis
(74) *Attorney, Agent, or Firm* — Schwegman Lundberg & Woessner, P.A.

(57) ABSTRACT

A digital transmitter architecture is disclosed to transmit (TX) multi-gigabit per second data signals on single carriers (SC) or orthogonal frequency division multiplexing (OFDM) carriers at millimeter wave frequencies in either one of a high-resolution modulation mode or a spectral shaping mode. The architecture includes a number of digital power amplifier (DPA) and modulation reconfigurable circuit segments to process individual bits of a data bit stream in parallel according to a specific circuit configuration corresponding to the selected TX mode using a multiplexer to switch between configurations.

20 Claims, 14 Drawing Sheets

(51) Int. Cl.
  *H03F 3/193* (2006.01)
  *H03F 3/24* (2006.01)
  *H03F 3/45* (2006.01)

(52) U.S. Cl.
  CPC ....... *H03F 3/45183* (2013.01); *H04L 27/361* (2013.01); *H03F 2200/451* (2013.01)

(56) References Cited

U.S. PATENT DOCUMENTS

2018/0092037 A1* 3/2018 Kerner .................. H04W 76/27
2020/0007116 A1* 1/2020 Agrawal ................ H04L 27/20

OTHER PUBLICATIONS

Kaushik Dasgupta, Saeid Daneshgar, Chintan Thakkar, Kunal Datta, James Jaussi, and Bryan Casper, "A 25 GB/s 60 GHz Digital Power Amplifier in 28nm CMOS", Intel Corporation, IEEE, Sep. 2017 (Year: 2017).*

Jong Seok Park, Yanjie Wang, Stefano Pellerano, Christopher Hull and Hua Wang, "A CMOS Wideband Current-Mode Digital Polar Power Amplifier With Built-In AM-PM Distortion Self-Compensation", IEEE Journal of Solid-State Circuits, Feb. 2018 (Year: 2018).*

Mohsen Hashemi; Yiyu Shen; Mohammadreza Mehrpoo; Morteza S. Alavi; Leo C. N. de Vreede, "An Intrinsically Linear Wideband Polar Digital Power Amplifier", IEEE Journal of Solid-State Circuits (vol. 52, Issue: 12, Dec. 2017) (Year: 2017).*

"International Application Serial No. PCT US2018 051667, International Preliminary Report on Patentability dated Apr. 1, 2021", 8 pgs.

"International Application Serial No. PCT/US2018/051667, International Search Report dated Jun. 3, 2019", 4 pgs.

"International Application Serial No. PCT/US2018/051667, Written Opinion dated Jun. 3, 2019", 6 pgs.

Jovanovi, Goran S, et al., "Linear Current Starved Delay Element", Nis. Serbia and Montenegro, Retrieved from the Internet: <URL:http://es.elfak.ni.ac.rsjPapersjJovano vic-StojcevLinearCurrentStarved-DelayElement.pdf>—[retrieved on Jun. 5, 2012]. (Jun. 29, 2005).

Seok, Park Jong, "A Highly Linear Dual-Band Mixed-Mode Polar Power Amplifier in CMOS with An Ultra-Compact Output Network", IEEE Journal of Solid-State Circuits. IEEE Service Center. Piscataway. NJ. USA. vol. 51. No. 8, [retrieved on Jul. 29, 2016], (Aug. 1, 2016), 1756-1770.

Stefan, Shopov, et al., "A \${D}\$ -Band Digital Transmitter with 64-QAM and OFDM Free-Space Constellation Formation", IEEE Journal of Solid-State Circuits. IEEE Service Center. Piscataway. NJ. USA. vol. 53. No. 7., (Jul. 1, 2018), 2012-2022.

* cited by examiner

ULTRA-HIGH DATA RATE DIGITAL MM-WAVE TRANSMITTER WITH ENERGY EFFICIENT SPECTRAL FILTERING

This patent application is a U.S. National Stage Filing under 35 U.S.C. 371 from International Application No. PCT/US2018/051667, filed Sep. 19, 2018 and published in English as WO 2020/060543 on Mar. 26, 2020, which is hereby incorporated by reference herein in its entirety.

FIELD

The present disclosure relates to wireless data communications and in particular, to innovative architectures and mechanisms to more increase rates of transmission in high frequency/low wavelength transmitters.

BACKGROUND

Modern communication systems constantly evolve to support highest possible data rates due to the ever-increasing demand on bandwidth. Modern orthogonal frequency division multiplexing (OFDM) transmitters, therefore, need to support both high symbol rates and high-order modulation formats. The maximum symbol rate is typically limited by the bandwidth of the transmitter front-end, while high-order modulation schemes are associated with large peak to average power ratios (PAPR) and are inefficient to transmit. Furthermore, transmitters need to minimize their adjacent channel and spurious spectral emissions to coexist in the populated wireless ecosystem. Meeting the spectral mask requirements typically involves a large oversampling factor, which not only increases the digital power consumption of the baseband, but also further increases the PAPR of the RF signal making the front-end even less power efficient. Current solutions generally compromise on one or more of the above performance metrics, and as a result, are not optimal.

A traditional approach using linear up-conversion architectures may often incorporate many bandwidth-limiting blocks (i.e., baseband, up-convert mixer, amplifier(s), and power amplifier) and need to be operated in linear-mode (i.e., at significant back-off) to maintain adequate modulation accuracy and spectral mask compliance. Such systems pose a limit on the maximum attainable symbol rate without equalization, as well as on the power efficiency of the system. The up-conversion-based solution essentially requires that all transmitter circuit blocks be operated in linear-mode where power efficiency is poor, as well as the numerous narrowband blocks in a transmit chain introducing significant frequency variation. This type of variation may require advanced pre-equalization, e.g., a 10-tap linear equalizer in a Data Over Cable Service Interface Specification (DOCSIS), which further contributes to the power consumption and increases system complexity.

To circumvent the bandwidth and efficiency limitations of the traditional approach, certain digital Cartesian and Polar architectures have been suggested which directly modulate an RF carrier as close as possible to the transmit antenna enabling the preceding circuit blocks to be operated in non-linear-mode. However, these digital solutions generally may not be used for modulation formats greater than 16-QAM due to their poor resolution and significant carrier leakage. Additionally, the lack of analog filtering in these digital architectures requires large oversampling ratios for spectral compliance, and increases the power consumption in the digital circuits. A solution to avoid these issues is thus highly desirable as disclosed in the following inventive embodiments.

BRIEF DESCRIPTION OF THE DRAWINGS

Example embodiments of circuits, logic operation, apparatuses and/or methods will be described, by way of non-limiting example only, in reference to the appended Drawing Figures in which.

DETAILED DESCRIPTION

Embodiments of the present invention relate to digital transmitter architectures and circuits that preferably, while operating at mm-wave frequencies: (a) have increased modulation resolution; (b) reduce carrier leakage and thus increase possible modulation depth, (c) provide low-power spectral shaping, and (d) increase throughput without sacrificing accuracy. These significant advances, and more, may be realized via compact digital power amplifier designs utilizing low-overhead mixed-signal pulse-shaping and equalization techniques with minimal complexity, as disclosed in the example embodiments below. While the innovative embodiments are described in reference to wireless communications equipment, such as 3GPP LTE or New Radio (NR) user equipment (UE) handsets, the innovative circuitry and principals set forth herein may be applicable to a variety of wired or wireless transmission technologies where similar architectures and techniques where similar advantageous may be obtained, and thus the invention is not limited to any particular communications format or protocols.

The embodiments disclosed herein provide solutions to the disadvantages of traditional upconversion designs and/or previously proposed digital transmitter techniques discussed above, enabling, for the first time, a viable digital transmitter architecture for communication devices with massive benefits including significantly reduced power consumption. As shown in Table 1 below, the solution of the inventive embodiments outperforms state-of-the-art linear up-conversion (traditional) and previously proposed digital transmitter solutions. In the context of next generation applications, e.g., 5G, embodiments of the present invention may reduce power consumption of a transmitter in a range of 1.5 times up to 3 times that of currently available devices. In one example user equipment (UE) handset with a 4 (16) element phased array, this translates to 0.3-1.2 Watts (1.2-4.8 W) less power consumed by the UE. This is a substantial reduction in power usage, and because transmitting typically consumes the vast majority of power in handset operation, depending on usage models, this may translate to extending battery life to roughly a proportional amount.

TABLE 1

Performance Characteristics of Prior
Solutions vs. Inventive Embodiments

| Performance Metric | Present Invention | Traditional TX 1 | Digital TX |
|---|---|---|---|
| Efficiency | ✓ | X | ✓ |
| High-order modulation formats | ✓ | ✓ | X |
| High symbol-rate | ✓ | ✓ | X |
| Baseband shaping/filtering overhead | ✓ | X | ✓ |
| Low digital power | ✓ | N/A | X |

Figure 1A:
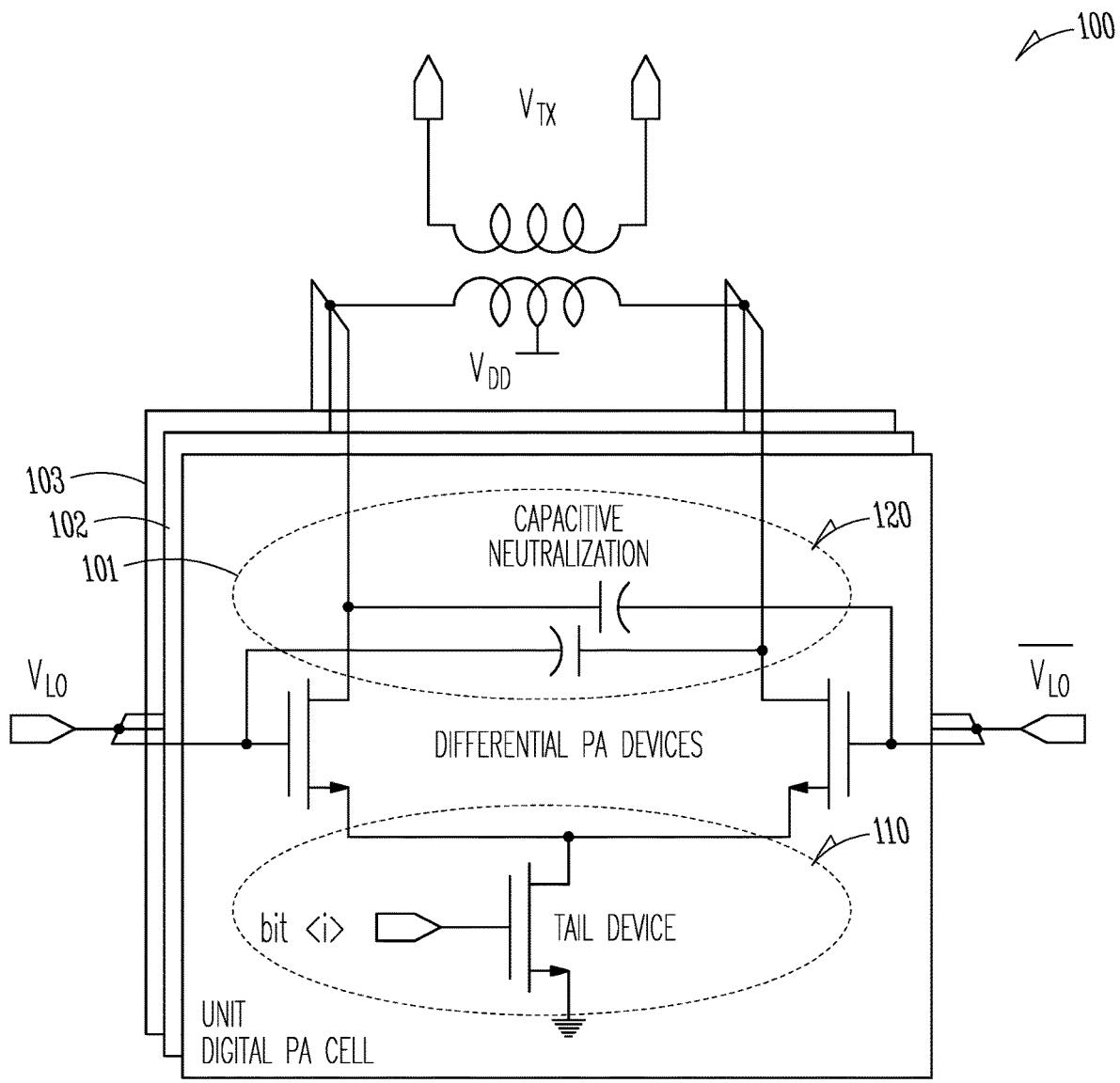
FIG. 1(a) shows a circuit diagram of an example tail device switching with capacitive neutralization digital power amplifier (PA) topology according to one embodiment of the disclosure.

Compact Neutralized Digital Power Amplifier (DPA) Circuit having High Efficiency and Modulation Depth A digital power amplifier (DPA) circuit 100 for use in mm-Wave transmitters according to one embodiment is shown and described in reference to FIG. 1(*a*). In this embodiment, DPA circuit 100 includes a tail switching circuit 110 in combination with a distributed capacitive neutralization circuit 120 for carrier leakage cancelation and enables the accurate transmissions of low amplitude symbols. This topology breaks the trade-off between modulation depth (defined as the ratio of the maximum to minimum amplitude symbol) and efficiency which, for the first time, enables transmissions at millimeter (mm)-wave frequencies using high-order modulation formats (e.g. >16-QAM, OFDM, DFT-S-OFDM, etc.) at high efficiencies (see Table 2 below).

Figure 1B:
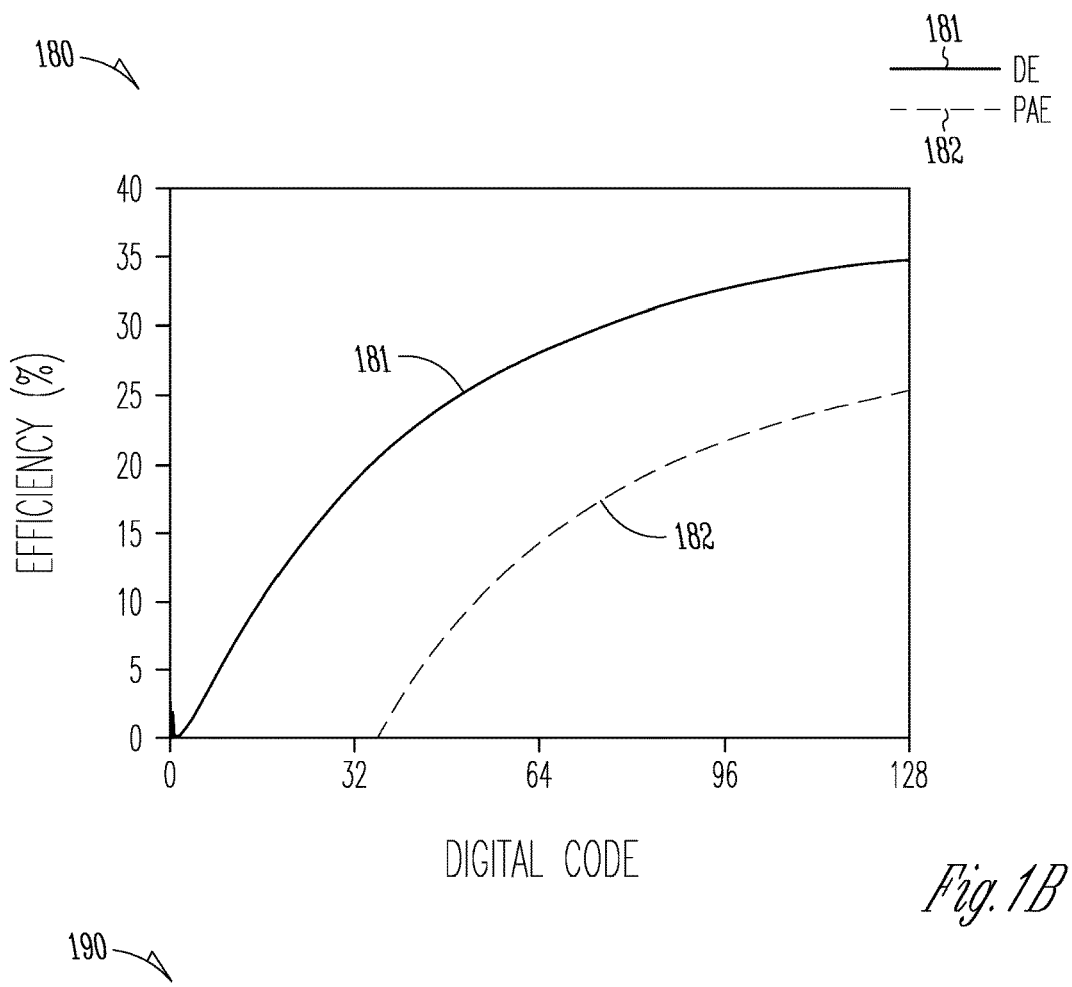
FIGS. 1(b) and 1(c) show efficiency and transfer characteristics of the example circuit versus digital code, respectively.
Figure 1C:
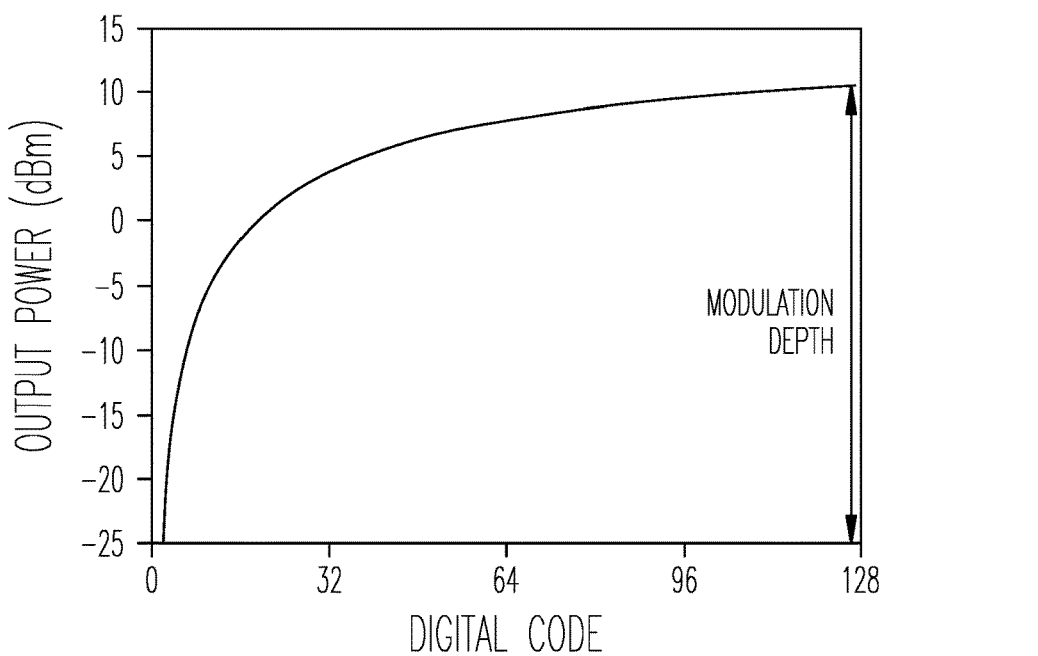

FIGS. 1*b* and 1*c* show the transfer characteristics 180 and efficiency 190, respectively, of mmWave transmissions using power amplifier circuit 100 with tail switching and capacitive neutralization circuitries 110, 120 according to an embodiment of the present disclosure. In certain embodiments, capacitive neutralization circuitry 120 is implemented in distributed fashion as shown, by local overlap regions between the source and drain metal stripes within each unit digital power amplifier cell 101, 102, 103. In this embodiment, local capacitive neutralization circuit 120 provides the following advantages:

(i) Broadband carrier leakage cancellation;
   (ii) Scalability to arbitrary large power amplifier sizes without modifying the circuitry of each unit cell; and
   (iii) Ultra-compact layout with minimal inductive parasitics to minimize the amplitude modulation (AM) to phase modulation (PM) distortion.

TABLE 2

Drain efficiency and modulation depth
comparison in digital PA topologies.

| Digital PA Topology | Drain Efficiency | Modulation Depth (Modulation Format) |
|---|---|---|
| Tail switching | ✓ | X |
| 1st approach | 28.5% | — (16-QAM) |
| $2^{nd}$ approach | 29.8% | 9 dB (16-QAM) |
| Cascade switching | X | ✓ |
| | 17.7% | 22 dB (64-QAM) |
| Tail switching with capacitive neutralization | ✓ | ✓ |
| | 34.5% | 35 dB (256-QAM, OFDM) |

Reconfigurable Embedded N-Tap FIR for Spectral Compliance Masking

In yet other embodiments of the present invention, a highly reconfigurable digital transmitter architecture that may operate over a large range of carrier frequencies, i.e., wideband, includes digital filtering circuitry because fixed analog filtering is not flexible enough to meet requirements over such a range. Thus in certain embodiments, digital filtering is the only viable solution that can meet spectral emission requirements or masks across a large range of carrier frequencies, e.g., transmissions compliant with certain standards like LTE-A or NR.

In discussion of the following preferred embodiments, a brief explanation of background for digital modulation communication systems and other relevant terms is provided. In digital communication systems, information is transmitted as a series of samples, each occupying a uniform time slot. Each sample encodes one of a finite number of "symbols", which in turn represent one or more binary digits (bits) of information. Each symbol is encoded as a different combination of amplitude and phase modulation of the carrier, so each symbol is represented by a point on a constellation diagram called a constellation point. The constellation diagram shows all the possible symbols that can be transmitted by the system as a collection of points in the XY-plane. The higher the modulation, the more constellation points are present on the diagram, the higher the resolution of data that can be encoded and modulated. After passing through a communication channel, due to electronic noise or distortion added to the signal to amplify it for modulation, and thus the amplitude and phase received by the demodulator may differ from the correct value for the symbol. When plotted on a constellation diagram the point representing that sample will be offset from the correct position for that symbol as shown in certain eye diagrams in the drawing figures.

Error vector magnitude or EVM (sometimes also called relative constellation error or RCE) is a measure used to quantify the performance of the digital radio transmitter or receiver. A signal sent by an ideal transmitter or received by a receiver would have all constellation points precisely at the ideal locations, however various imperfections in the implementation (such as carrier leakage, low image rejection ratio, phase noise, etc.) cause the actual constellation points to deviate from the ideal locations. Informally, EVM is a measure of how far the points are from the ideal locations. Noise, distortion, spurious signals, and phase noise all degrade EVM, and therefore EVM provides a comprehensive measure of the quality of the radio receiver or transmitter for use in digital communications.

Because intersymbol interference (ISI) is a linear effect, it can be mitigated by applying a filter to flatten the frequency response of the channel. This process is known as "equalization" and can be applied at either a transmitter or receiver. When equalization is applied at the transmitter it is frequently termed "pre-emphasis" and de-emphasis at the receiver. To be adaptable, pre-emphasis must use a protocol to feedback the channel characteristics. There are several different techniques available for equalization, all with different engineering trade-offs in power consumption, performance and cost. The simplest approach is Feed Forward Equalization (FFE). This employs a finite impulse response filter (FIR) with a series of tap weights programmed to adjust the impulse and, by duality, frequency response. This is the simplest implementation and can be designed entirely in the analog domain. Such an approach lends itself to very high speed and usually offers relatively low power. However, FFE also offers limited performance; generally considered insufficient for the majority of 10 Gbps communication systems and is therefore often overlooked in modern communication designs.

Figure 2:
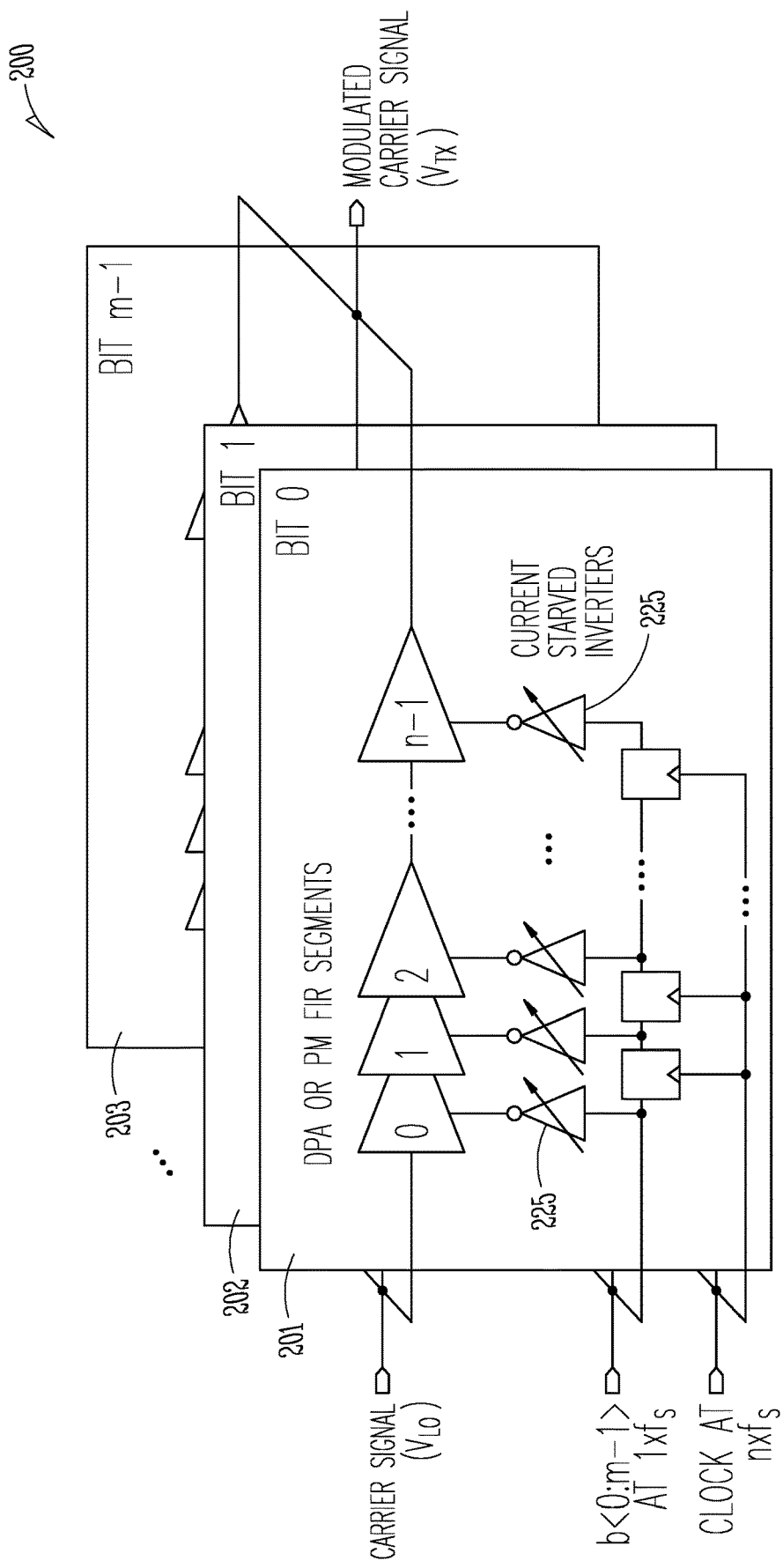
FIG. 2 shows a basic circuit diagram of an example digital power amplifier (DPA) embodiment where bits may be segmented into sub-units in the RF domain for n-tap finite impulse response filtering according to other embodiments of the present disclosure.

Referring to FIG. 2, digital power amplifier (DPA) circuitry 200 according to one embodiment performs FFE uses analog domain finite impulse response (FIR) filtering on both phase-modulator (PM) and amplitude-modulator (AM) signal paths by separating the bits (1–(M–1)) for transmission into parallel paths of DPA circuit segments 201, 202 and 203 to be amplified and modulated onto the carrier. In various embodiments for FIR filtering, each bit is further segmented at the digital PA/modulator into sub-units (0 to (n−1)) representing the tap strengths of the FIR filter where the sub-units are delayed by $f_s$ to shift their phases. The sub-units are then driven with shifted phases of the data sequences to shape the time-domain transmitter waveforms, for example using current starved inverters 225 and reduce the undesired spectral emissions of the carrier modulated signal for transmission. This approach has been tested and performed well at mm-wave frequencies for two equal strength FIR taps. Certain inventive embodiments extend this to n-taps from 0 to (n−1) with arbitrarily sized tap strengths, as illustrated in FIG. 2. A distinct advantage of embodiments using this design over conventional digital oversampling techniques (n×rate) is that it consumes less baseband digital power since the baseband data is switched at the UI rate (1×rate).

Figure 3A:
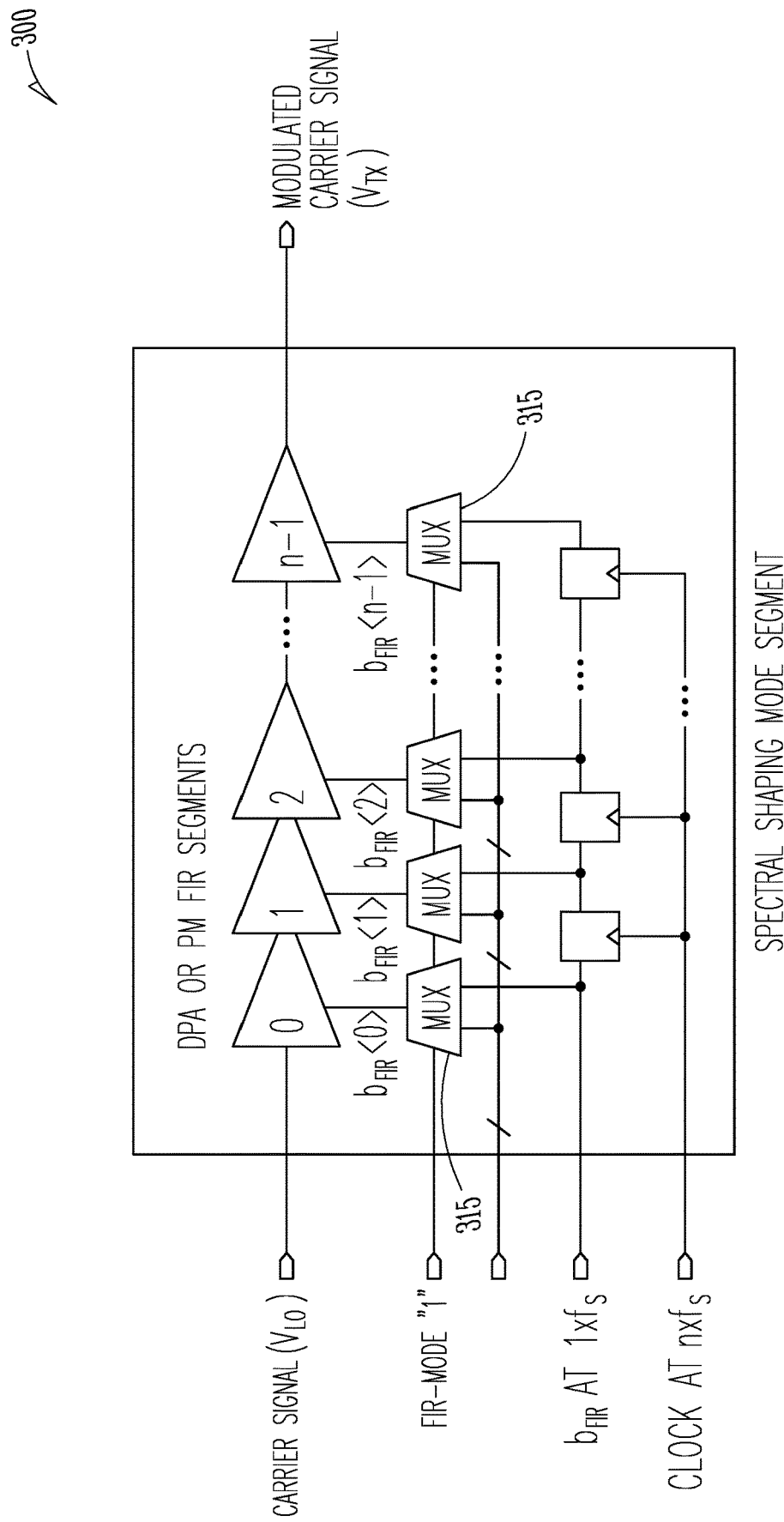
FIGS. 3a and 3b shows basic circuit diagrams of an exemplary reconfigurable digital power amplifier (DPA) according an embodiment of the present disclosure with one or more FIR filtering segments (FIG. 3a) for spectral shaping/compliance, and (b) a high-resolution segment (FIG. 3b) for modulating using higher order constellations and/or lower error vector magnitude (EVM)
Figure 3B:
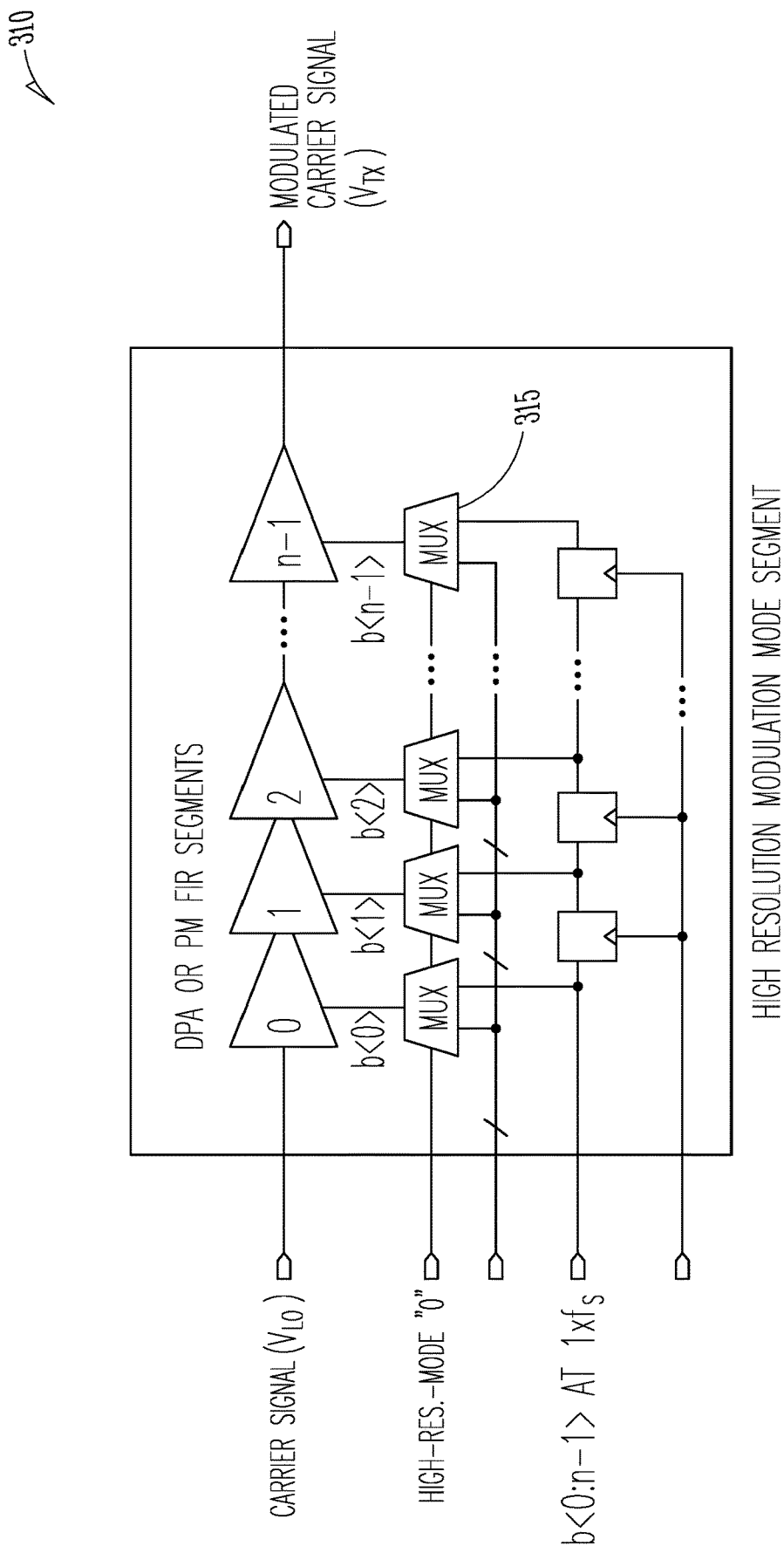

Referring to FIGS. 3a and 3b, according to yet other inventive embodiments, a reconfigurable DPA/modulator in a transmitter includes different-purposed digital power amplifier circuits 300 and 310 which are selected for modulating transmissions based on the type of communication network or protocols for which the transmitter is communicating. DPA circuits 300 and 310 are selectable to provide the corresponding transmitter a high degree of flexibility and take advantage of particular strengths of one DPA circuit design versus the other, based on the type/mode of transmission required. In one example embodiment, different-purposed DPA circuits/segments 300 or 310 may be enabled according to a preferred mode of transmission selected from: 1). a spectral shaping mode (also referred to as "FIR mode"); or 2.) a high resolution mode (or "Hi-res mode") capable of modulating greater a bandwidth of data on the carrier.

While FIR circuits 200 of FIG. 2 and 300 of FIG. 3a provide excellent spectral shaping in transmitting, for example, to comply with various communications standards such as 3GPP LTE-Advanced Rel. 12+ or New Radio (NR), a.k.a., "5G," it may do so at a cost of transmitter overall resolution capabilities because no filtering delay is encountered. In the case it may be desirable to utilize a higher transmit resolution than generally available with FIR segment 300 of FIG. 3a, e.g., in proprietary networks/links that support higher resolutions and without strict spectral shaping conformance, the various inventive embodiments may include a reconfigurable digital power amplifier circuitry adapted to switch from FIR TX mode operation to achieve greater bandwidth in a high resolution mode or "hi-res mode." An example hi-res mode circuit 310 is depicted in FIG. 3b.

Thus, as shown in FIGS. 3a and 3b, a transmitter of certain inventive embodiments may include DPA circuitry/segments configured to operate in a first mode, e.g., "spectral shaping mode" using FIR-mode circuits 300, to transmit in compliance with the spectral emission masks of a first communications network, or operate in a second mode, using "hi-rez" circuits 310 to transmit to a second, different, communications network or device using potential proprietary solutions that support higher resolution communication without the strict spectral emission requirements. In certain embodiments, high-resolution mode circuits 310 provide a reduced error vector magnitude (EVM)/quantization noise, relative to FIR segments 300, and enable modulating transmissions with higher order constellations. In preferred embodiments, FIR mode circuits 300 and Hi-Res circuits 310 may be present on the same circuit, but having different inputs multiplexed by MUXs 315 and configured by a control bit, e.g., '1' for FIR mode or '0' for Hi-rez mode. This control bit may be provided by the baseband processor, which knows the protocol/network from control channel signaling, or other circuit, depending on device architecture, and when set to '1' for FIR mode, the configuration shown in FIG. 3a is enabled and bit sub-units (b<0: n−1) are fed into the FIR circuit 300 at a rate of 1×$f_s$ with phase delay clock signal of n×$f_s$. When control bit is set to '0' for Hi-rez mode, bit sub-units (b=0:n−1) are simply fed in at 1×$f_s$.

Rise-Time Filtering

In order to filter out-of-band (OOB) frequency aliases from digital-to-analog conversion (DAC) operations, conventional digital transmitters utilize a large digital oversampling ratio. This degree of oversampling, particularly at a multiple giga-symbol per second ($G_{sym}$/s) rate, is extremely power consuming for a mobile or battery-powered device. Thus in various embodiments of the present invention oversampling is limited to 4× or less 402 and attenuating OOB content is performed by analog pulse-shaping on the digital phase modulation and amplitude modulation drivers. In various embodiments, this analog pulse shaping includes slowing down pulse edges by increasing the resistor-capacitor (RC) time constants of the digital circuits that drive the digital PA/modulator bits. An increased RC time constant is equivalent to convolution in the time-domain or to a 1st order filter in the frequency domain.

Figure 4:
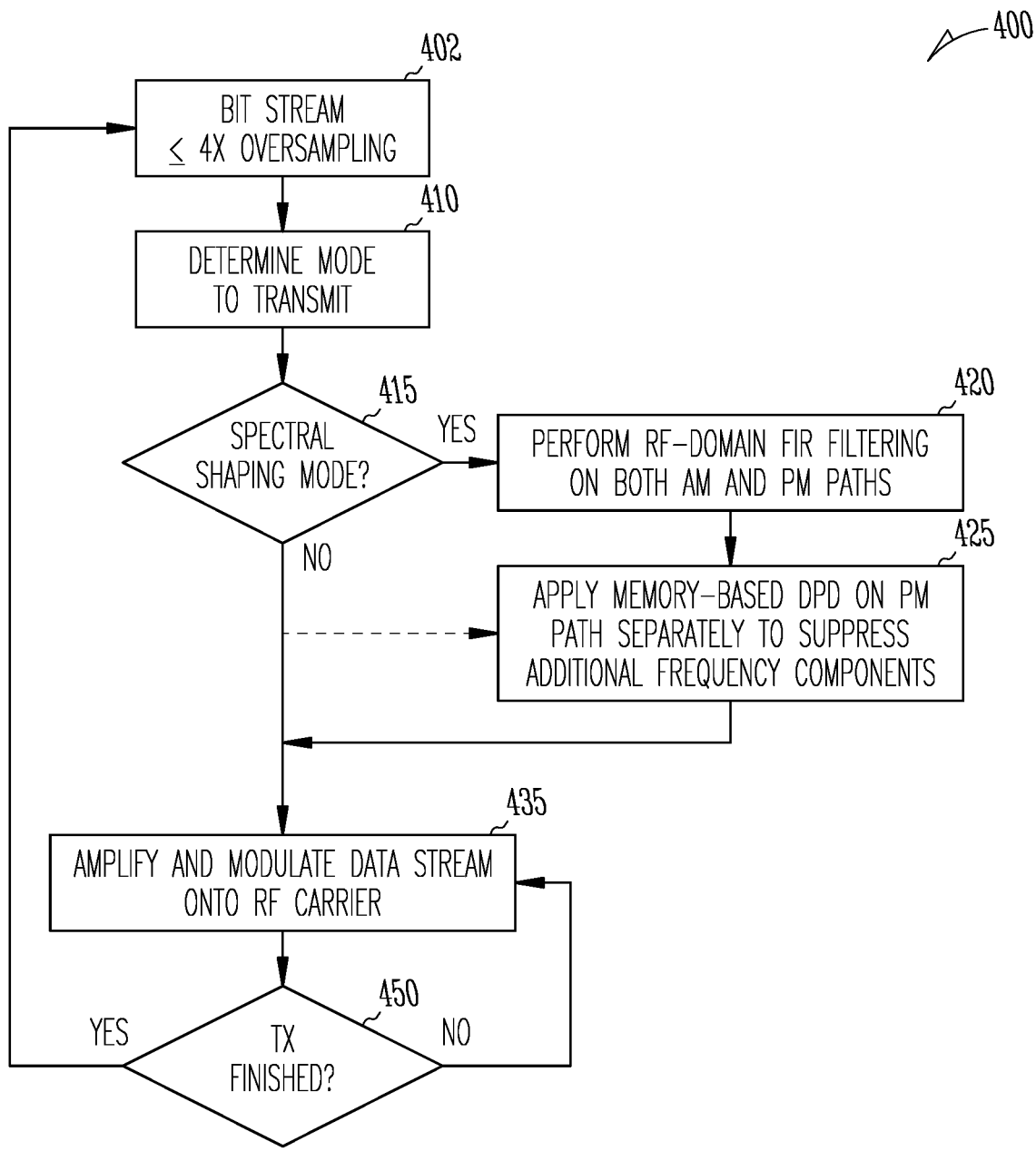
FIG. 4 is a flow diagram illustrating a method 400 of reconfiguring transmissions using a first mode to a first network or device having spectral conformance requirements or a second mode, having a greater modulation resolution, than the first mode, according to certain embodiments of disclosure.
Figure 5A:
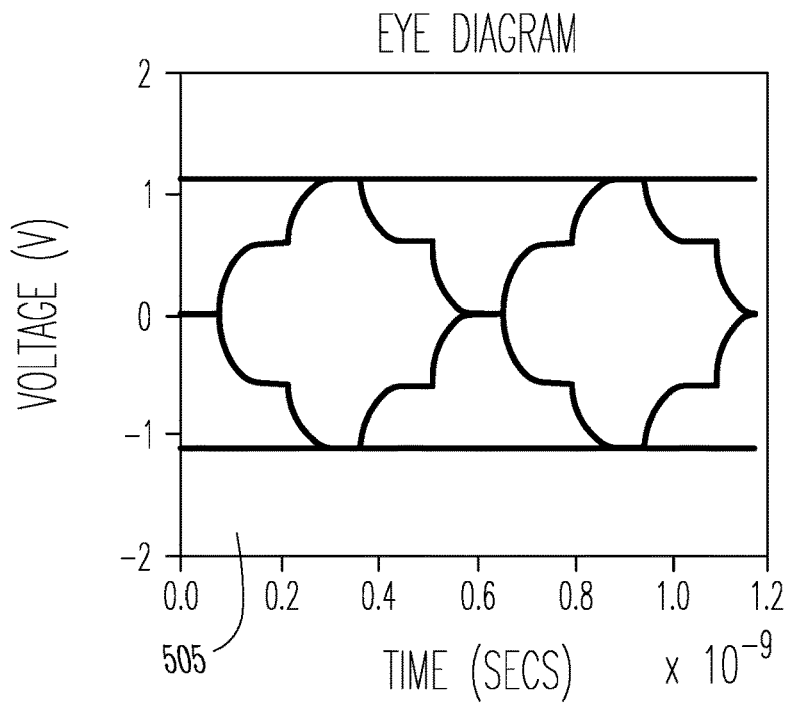
FIGS. 5a-5d are graphical representations of simulated performance results of embodiments relating to single carrier (SC) operating in a spectral conformance mode and a hi-res mode according to various embodiments.
Figure 5B:
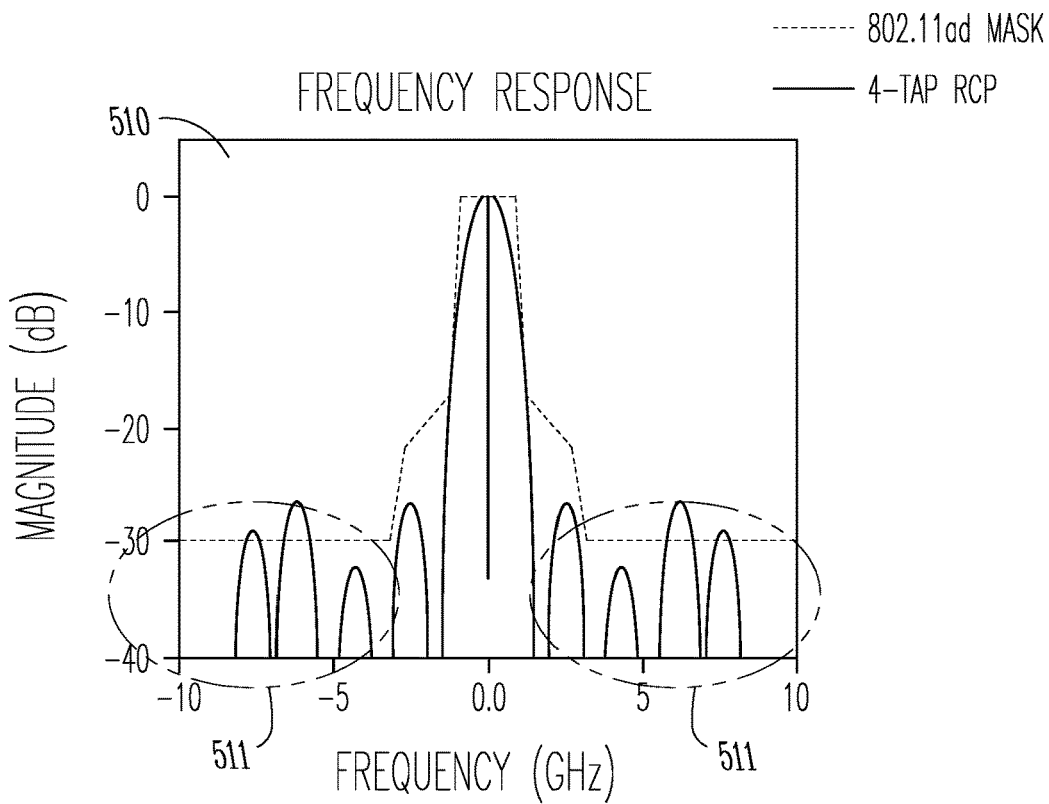
Figure 5C:
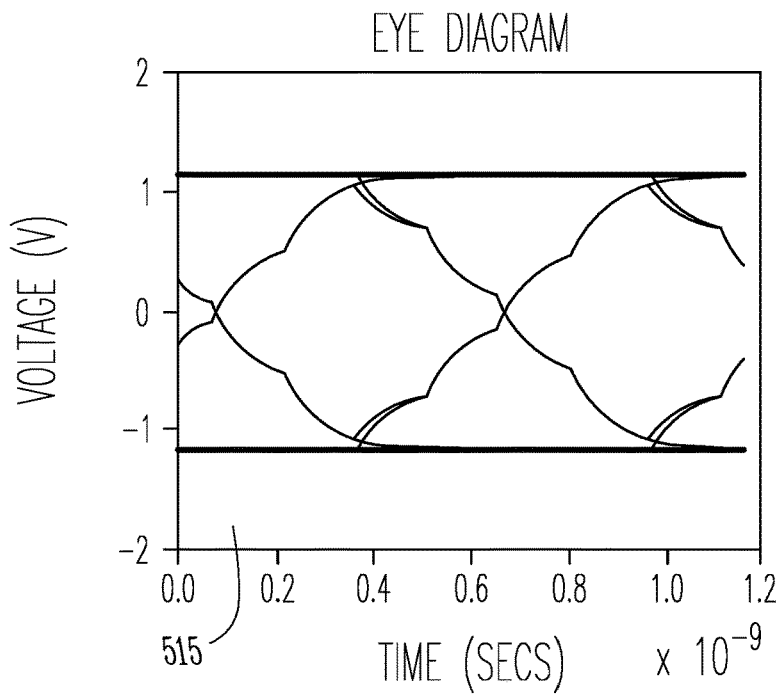
Figure 5D:
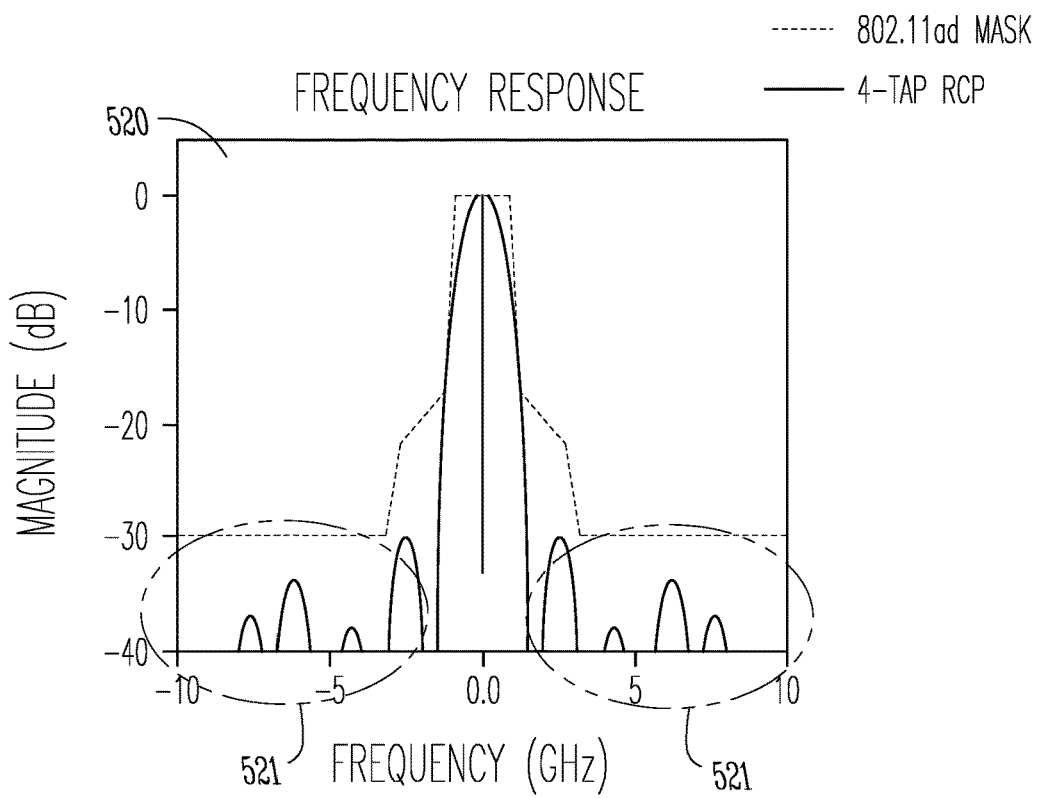

An example method of transmitting 400 at mmWave frequencies using a digital transmitter according to an embodiment of the invention is described in reference to FIG. 4. Method 400 initially includes determining 410 a TX communication mode in which to transmit between spectral shaping mode (i.e., FIR mode) and hi-resolution modulation mode. If 415 operating digital transmitter in spectral shaping TX mode, method 400 includes performing 420 RF-domain finite impulse response (FIR) filtering on both the PM and AM paths. As mentioned previously, in various embodiments, this is done by further segmenting digital PA/modulator bits into sub-units representing tap strengths of the FIR filter and driving them with shifted phases of the data sequences to shape the waveform in the time-domain.

The embodiments handle phase modulation (PM) and amplitude modulation (AM) paths separately so that next, an optionally, method 400 includes predistorting 425 the data stream to be transmitted to suppress additional undesirable components. In preferred embodiments, pre-emphasis/pre-distorting 425 is performed only in FIR mode by applying a memory-based digital predistortion (DPD) algorithm only on the PM path, though the embodiments are not limited thereto. Other solid state amplifier linearization methodologies could be utilized on the PM path only or on both AM/PM paths if practical. Further, as shown by the optional dotted line, the DPD could be used in hi-rez mode also, if desired. Lastly, the data signal is amplified and modulated 435 onto one or multiple RF carrier(s).

Referring to FIG. 5a-5d, example representative single-carrier (SC) simulations 505, 510, 515 and 520 are shown. In one example embodiment, a 10 dB analog alias suppression is applied to a single carrier before amplification and modulation although the inventive embodiments may also be applied in multi-carrier OFDM transmissions as shown by simulation representations in FIGS. 6a thru 6f, respectively.

Figure 7A:
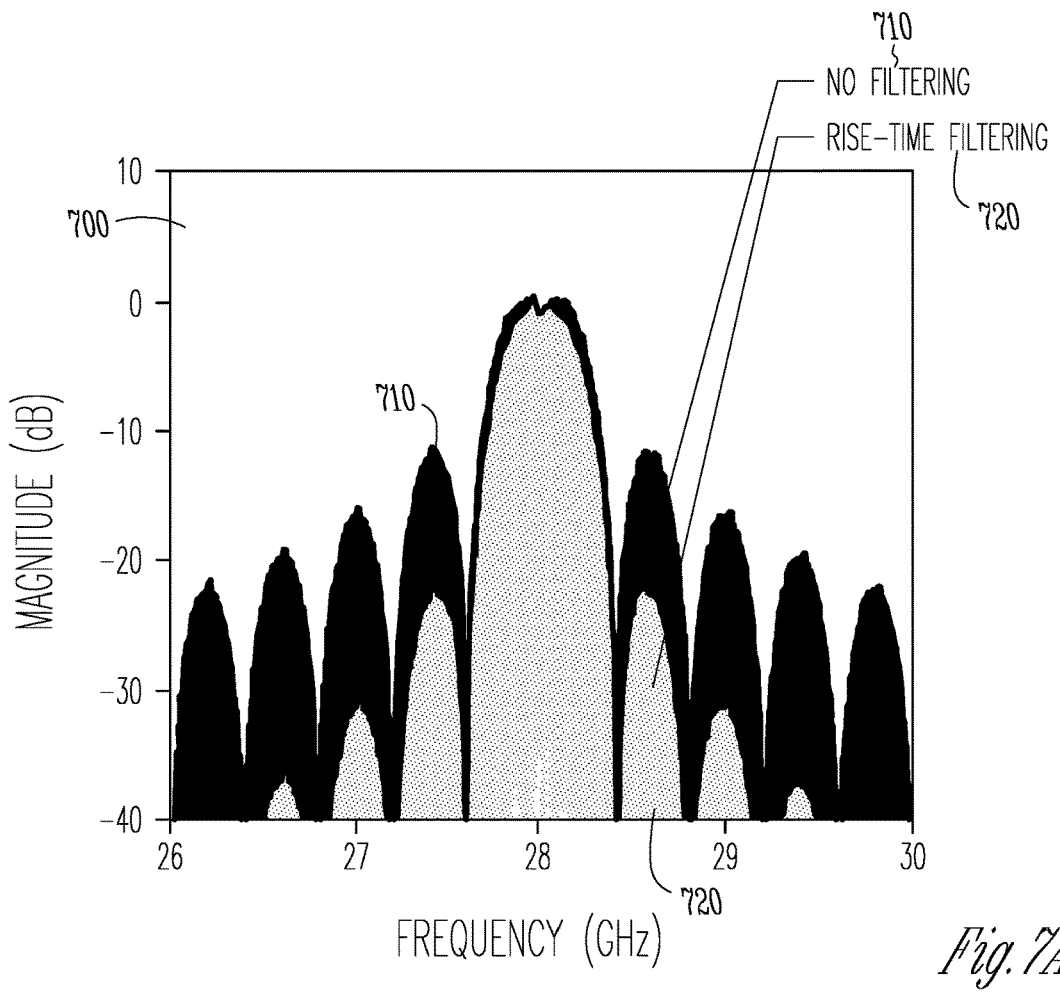
FIGS. 7a and 7b respectively illustrate a representative simulation output of a dual TX mode digital power amplifier/modulator and a current starved inverter of example embodiments.
Figure 7B:
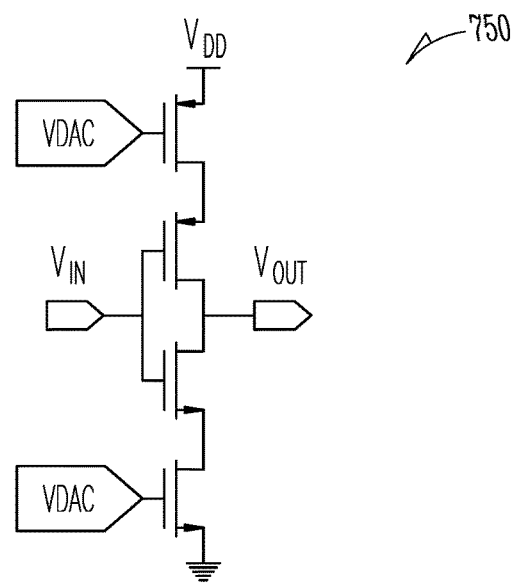

In the various embodiments, configurable out-of-band filtering may be achieved across different channel bonding and symbol rates using a programmable current starved inverter driver (e.g., 225 in FIG. 2; 750 in FIG. 7b). The impact of slowing down the rise-time (i.e., increasing the RC time constants=slowing the pulse rise time) of pulse edges through a transmitter with 4-tap FIR filtering, is shown in the time-domain by representations 505 (fast RC) and 515 (slowed RC) in FIGS. 5a and 5c, and in the frequency-domain representations 510 (fast RC) and 520 (slowed RC) of FIGS. 5b and 5d. As can observed, significant out of band frequencies 511 are filtered 521 between FIGS. 5b and 5d using such an aliasing technique.

While desired alias suppression may be achieved by lowering the analog filter cut-off frequency through segmentation and phase delay of bit sub-units alone, this may result in imperfect pulse settling and therefore a tradeoff may occur in the resulting transmission error vector magnitude (EVM).

Figure 6A:
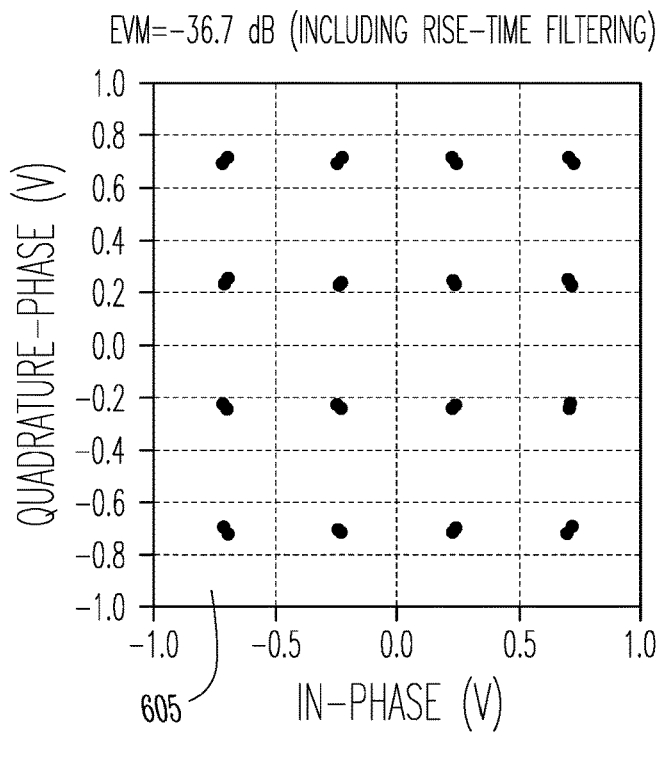
FIGS. 6a-6f illustrates example representations of embodiments impact OFDM simulations of: (a) error vector magnitude (EVM) and (b) spectrum with only limited rise time filtering to achieve low EVM; (c) EVM and (d) spectrum with significant rise time filtering to attenuate aliases; as well as (e) EVM and (f) spectrum for rise time filtering with frequency domain equalization to simultaneously achieve low EVM and alias attenuation.
Figure 6B:
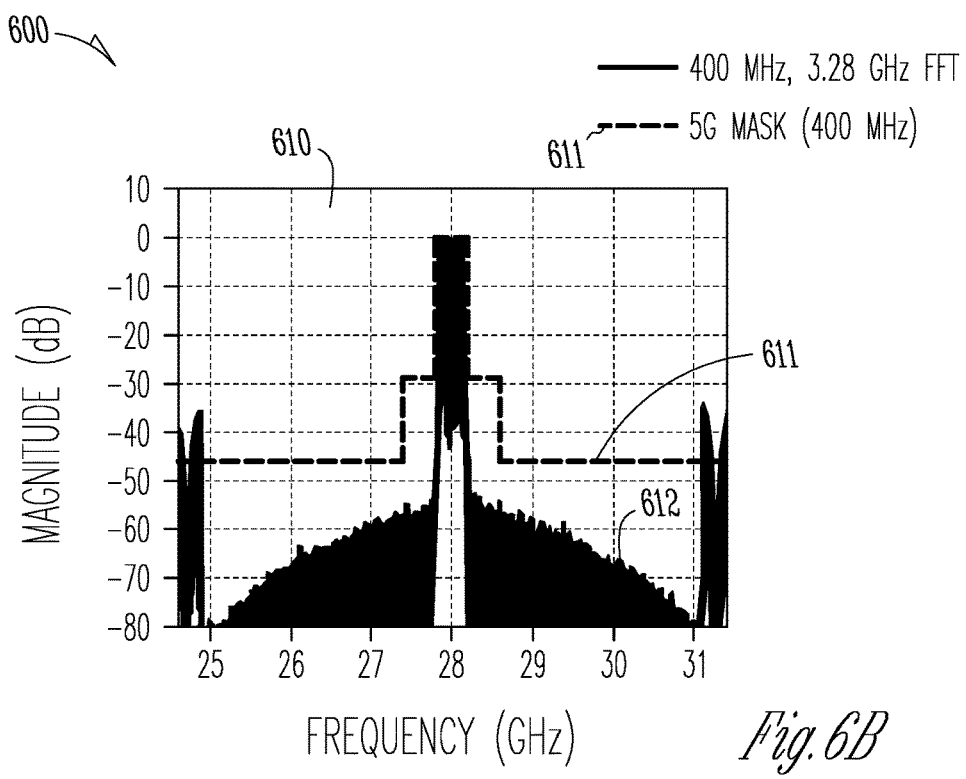
Figure 6C:
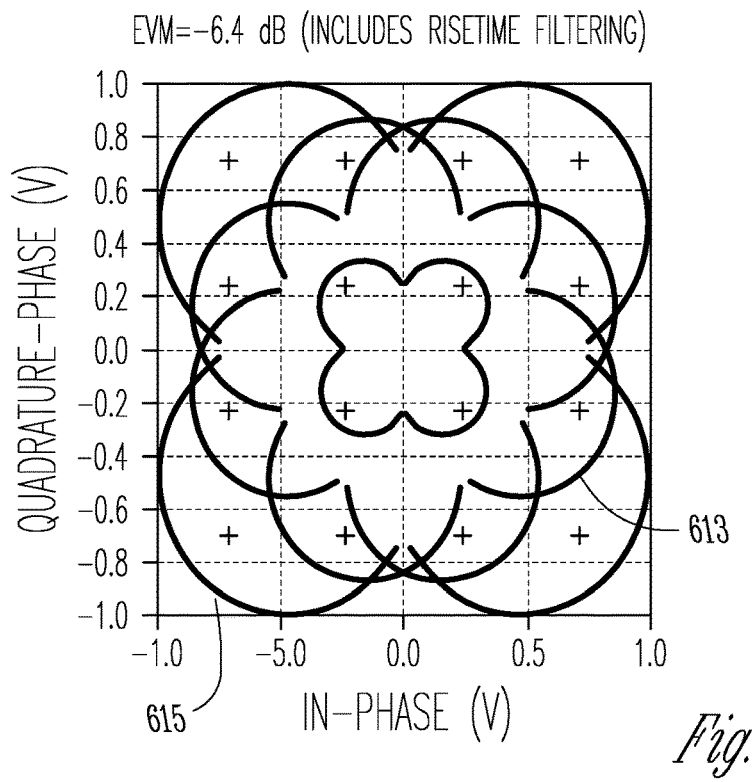
Figure 6D:
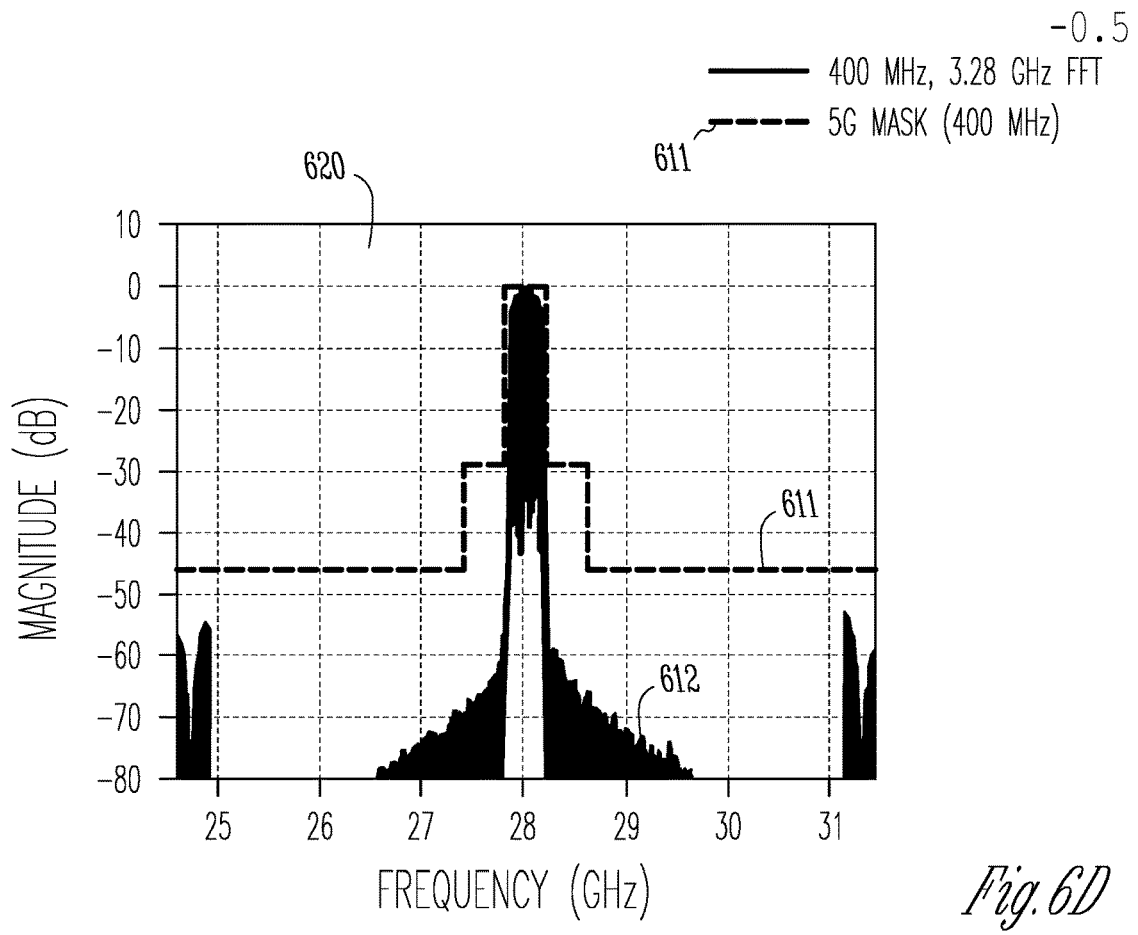
Figure 6E:
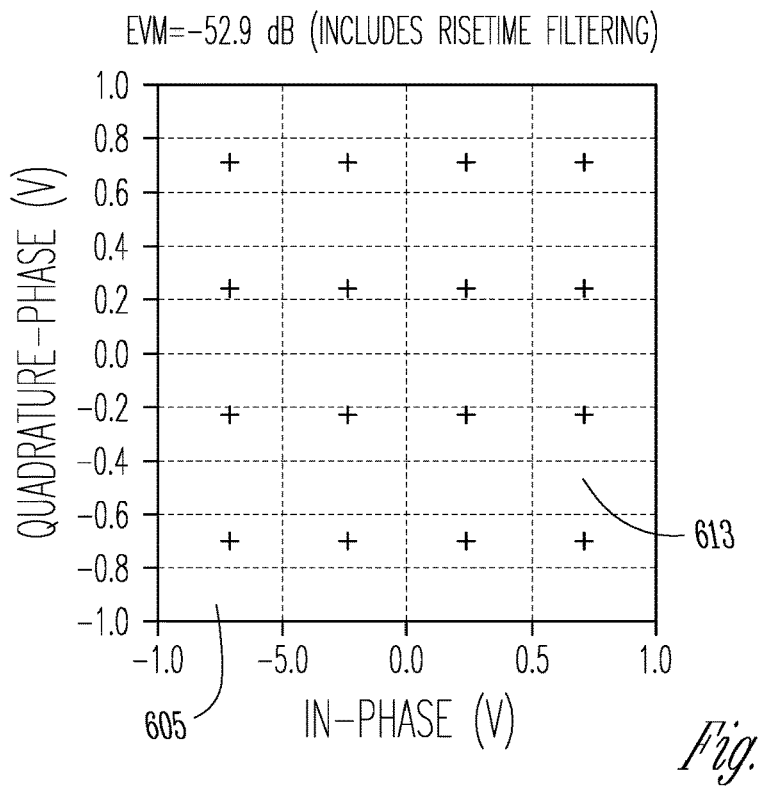
Figure 6F:
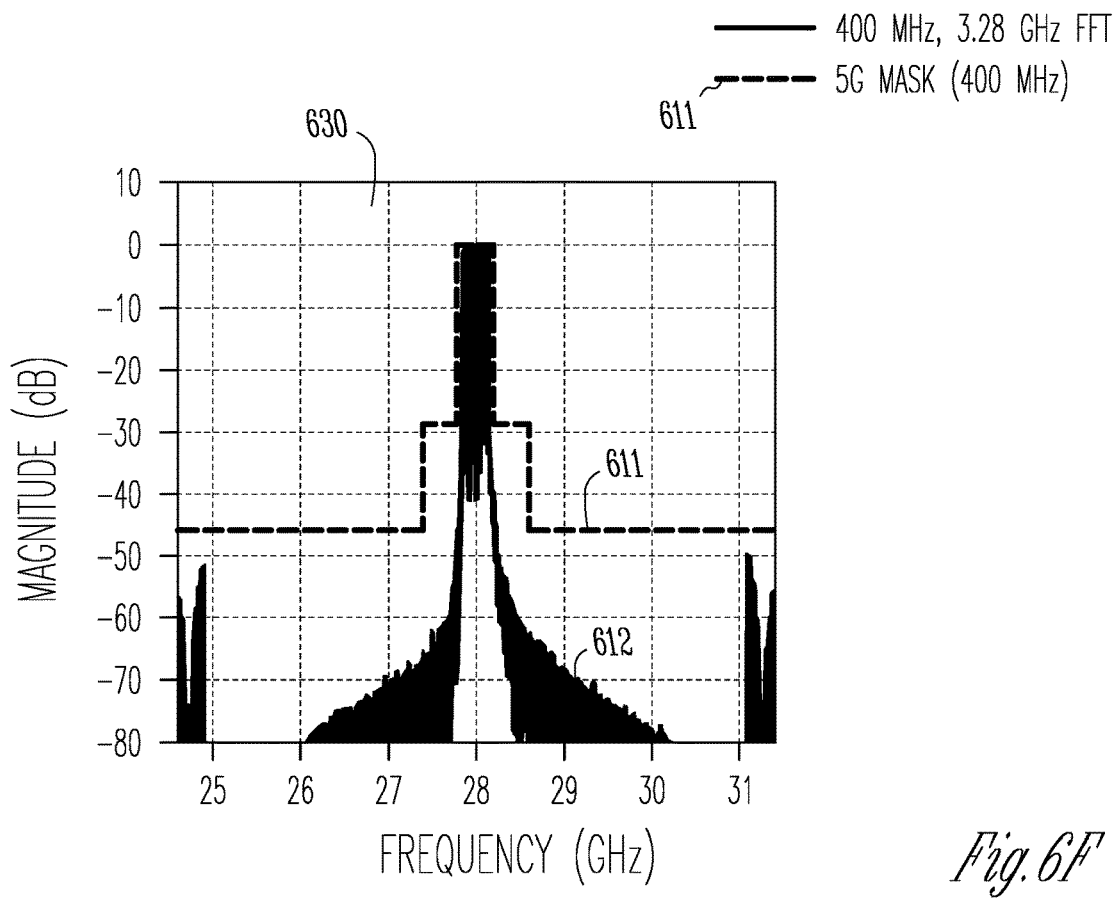

FIGS. 6a-6f show OFDM simulations of various approaches for noise suppression in a digital transmitter. FIGS. 6b, 6d and 6e show an example spectral mask 611 required for compliance with 5G standards, as well as the frequencies 612 obtained from each approach. FIGS. 6a and 6b illustrate respective EVM and spectrum representations 605 and 610 using an approach with only limited rise-time filtering to preserve a low EVM. FIGS. 6c and 6d show respective simulations of EVM and spectrum 615 and 620 using the approach with rise-time filtering significantly increased to achieve higher attenuation aliasing, but with the result of increased EVM. Lastly, FIGS. 6e and 6f show respective simulations for EVM 625 and and spectrum 630 for limited rise-time filtering but with frequency domain equalization/digital pre-distortion, to achieve a reduced EVM with the limited alias attenuation.

As can be observed in representations 615 and 620 of FIGS. 6c and 6d, using more aggressive orthogonal frequency division multiplexing (OFDM) alias suppression, such as is required for conformance with spectral mask 611 of 5G standards or the like, the cut-off frequency of the 1st order filter must be further reduced, in comparison with frequencies 612 in representation 610 of FIG. 6b, to ensure side lobes do not exceed mask 611. However, increased aliasing alone can severely degrade the TX EVM 613 as shown in representation 615 of FIG. 6c. Accordingly, in certain embodiments of the present invention, this tradeoff may be eased by using linearization pre-distortion, in both SC (in the time-domain on the entire data stream) and OFDM (in the frequency domain, on each IFFT blockset) modes. The latter is demonstrated in FIGS. 6e and 6f, where the aliases are suppressed by a total of 21 dB with minimal impact on EVM 613 as a result of using frequency domain equalization. Importantly, the resultant power out ($P_{out}$) attenuation due to such pre-distortion is significantly lower than with increased alias suppression by itself, which can be mitigated with marginally higher oversampling in comparison. Therefore, in some preferred embodiments, the combination of pre-distortion and analog aliasing or "rise-time filtering" of a transmit signal provides an optimal solution for digital power amplifiers in a millimeter wave transmitter providing acceptable spectral filtering with a reasonable EVM.

FIG. 7a illustrates a representative simulation output 700 of a dual TX mode digital power amplifier/modulator according to preferred embodiments. A first hi-rez modulation mode output 710 results when no rise-time aliasing rejection is used, i.e., without aliasing rejection to enable increased resolution transmissions; and a second spectral-shaping mode output 720 when rise-time filtering of digital drivers with programmable alias rejection is applied for transmit applications requiring strict spectral conformance.

FIG. 7b illustrates an embodiment for a configurable current starved inverter 765 which, when used in a dual-mode DPA architecture as described herein, may provide the output 720 of FIG. 7. It should be recognized that alternate circuit configurations may also be utilized if providing the rise-time filtering results described herein.

Linear Predistortion for Linear Bandwidth Limited to Nonlinear Phase Path

In most polar transmitter architectures, the phase modulation (PM) path typically goes through more cascaded amplifier stages than the amplitude modulation (AM) path that is the final power amplifier stage. As a result, the PM path may suffer from degraded bandwidth and have a different frequency response than the AM path. At high symbol/s-rates, in order to achieve an acceptably low EVM, it may be important to mitigate any such bandwidth limitations.

Accordingly, a digital polar transmitter according to certain embodiments, improves over previous designs, which use non-linear memory algorithms that require unreasonably large look-up-tables (LUTs) that scale as a function of M(N) where M is the number of symbols and N is the number of memory taps, and thus conventional LUT pre-distortion methods are impractical when high-order modulation formats are used.

Figure 8A:
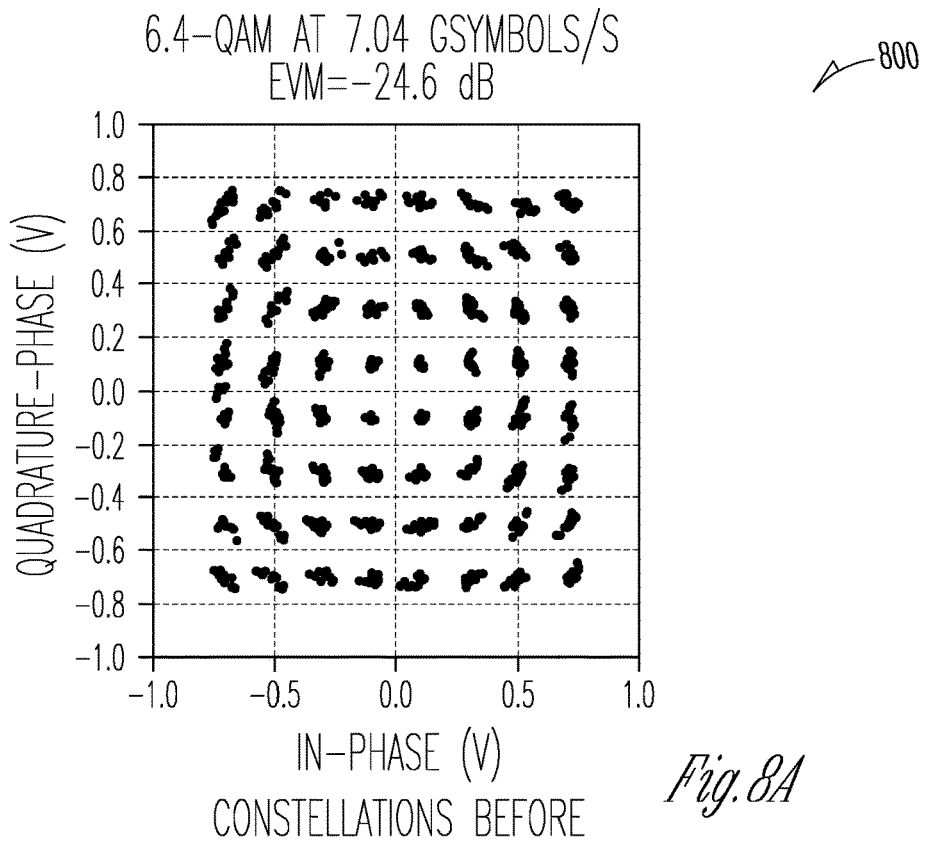
FIGS. 8a and 8b show example embodiments with simulated 64-QAM modulation constellations before and after linearization DPD is applied according to other embodiments.
Figure 8B:
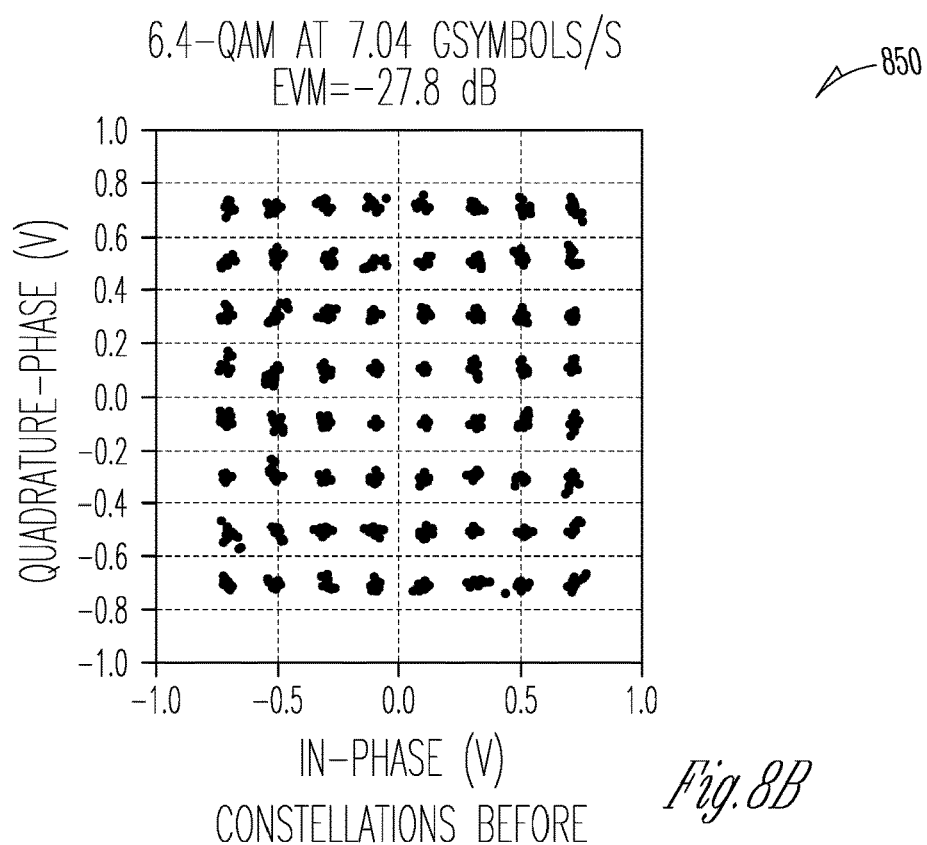

Referring to FIGS. 8a and 8b, certain embodiments of the present invention instead separate the phase and amplitude modulation paths, treating their bandwidth response separately, using linear equalization. Using this approach on 64-quadrature amplitude modulation (QAM) for a 42 Gb/s data rate (FIG. 8a), a significant EVM improvement was achieved using a 2-tap FIR filter on the phase path only (FIG. 8b). Very importantly, the linear I/O phase correction and calibration on the PM path is unaffected to the non-linear amplitude saturating stages in the AM driver chain. Such phase-amplitude independence dramatically reduces the complexity of pre-emphasis circuitry cost and power consumption, where FIG. 8a shows and 8b show a simulated 64-QAM constellation before and after linear memory-based digital predistortion (DPD) where the simulated results include RC extraction and EM simulated passives.

Figure 9:
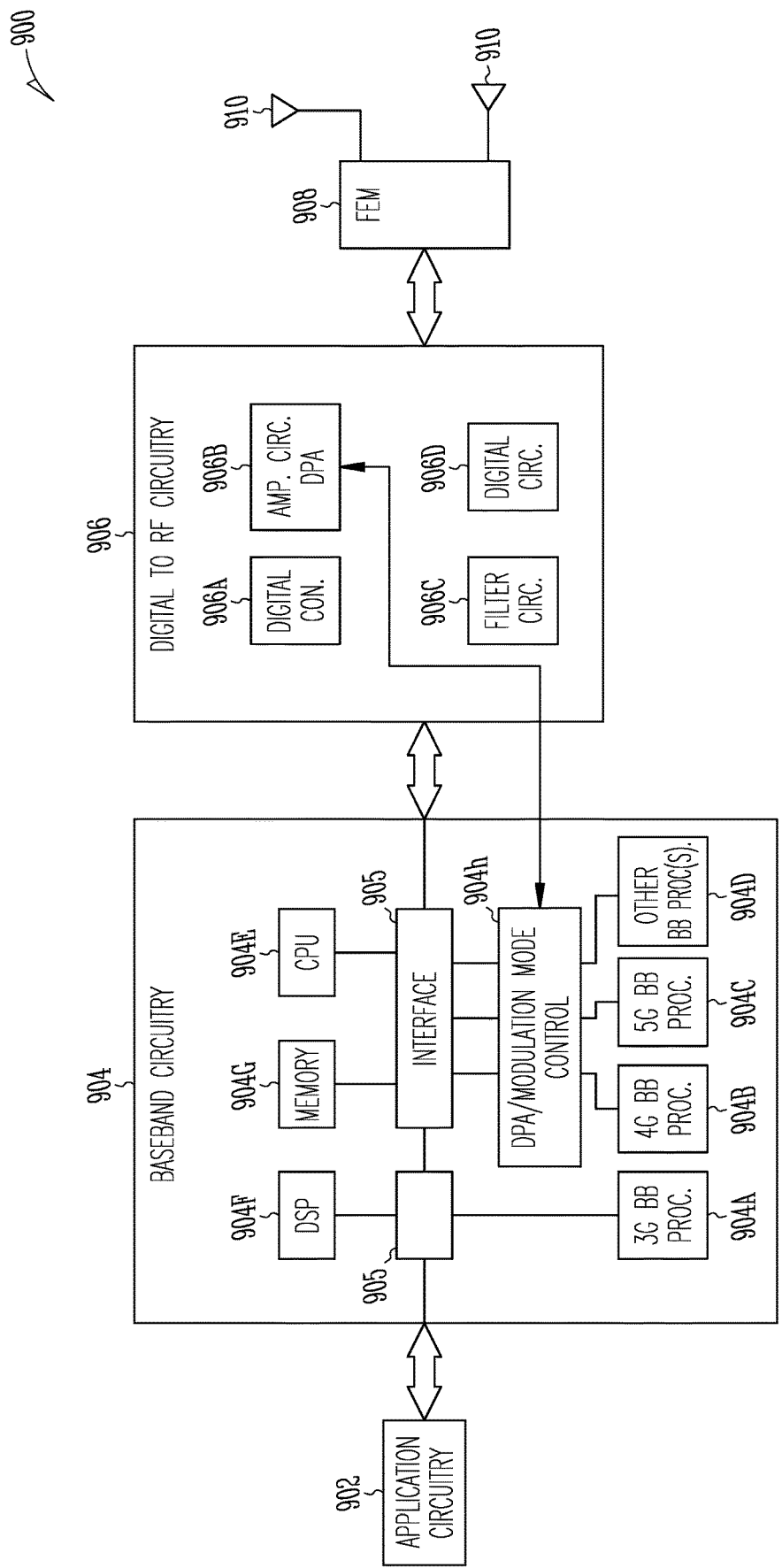
FIG. 9 shows an example block diagram of a wireless device such as user equipment (UE) including a wideband digital transmitter according to an embodiment of the present disclosure.

Referring to FIG. 9, a wireless communication device 900 is configured to perform digital modulation of transmissions modulating an RF carrier with a pulsed waveform representing a digital data stream using the TX modes as described in prior embodiments. As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

Embodiments described herein may be implemented into a system using any suitably configured hardware and/or software. FIG. 9 illustrates, for one embodiment, example components of an electronic device 900. In embodiments, the electronic device 900 may be, implement, be incorporated into, or otherwise be a part of a user equipment (UE). In some embodiments, the electronic device 900 may include application circuitry 902, baseband circuitry 904, digital to Radio Frequency (RF) circuitry 906, front-end module (FEM) circuitry 909 and one or more antennas 910. Electronic device 900 may include interconnects (shown by arrows and dark lines) such as PCIe, Advanced eXtensible Interconnect (AXI) or open core protocol (OCP) or the like to exchange information and/or signals between a host, various peripherals or sub-peripherals, referred to as components. And each component using the interconnect, must have an interface 905 to do so.

The application circuitry 902 may include one or more application processors or processing units. For example, the application circuitry 902 may include circuitry such as, but not limited to, one or more single-core or multi-core processors 902a. The processor(s) 902a may include any combination of general-purpose processors and dedicated processors (e.g., graphics processors, application processors, etc.). The processors 902a may be coupled with and/or may include computer-readable media 902b (also referred to as "CRM 902b", "memory 902b", "storage 902b", or "memory/storage 902b") and may be configured to execute instructions stored in the CRM 902b to enable various applications and/or operating systems to run on the system and/or enable features of the inventive embodiments to be enabled.

The baseband circuitry 904 may include circuitry such as, but not limited to, one or more single-core or multi-core processors to arrange, configure, process, generate, transmit, receive, or otherwise determine time differences of carrier aggregation signals as described in various embodiments herein. The baseband circuitry 904 may include one or more baseband processors and/or control logic to process baseband signals received from a receive signal path of the digital to RF circuitry 906 via an interconnect interface 905 and to generate baseband signals for a transmit signal path of the digital to RF circuitry 906. Baseband circuity 904 may also interface 905 via an interconnect, with the application circuitry 902 for generation and processing of the baseband signals and for controlling operations of the Digital to RF circuitry 906. For example, in some embodiments, the baseband circuitry 904 may include a third generation (3G) baseband processor 904a, a fourth generation (4G) baseband processor 904b, a fifth generation (5G)/NR baseband processor 904c, and/or other baseband processor(s) 904d for other existing generations, generations in development or to be developed in the future (e.g., 6G, etc.). The baseband processing circuit 904 (e.g., one or more of baseband processors 904a-d) may handle various radio control functions that enable communication with one or more radio networks via the RF circuitry 906, including TX mode selection. The radio control functions may include, but are not limited to, signal modulation/demodulation, encoding/decoding, radio frequency shifting, as well as measuring time difference between carrier aggregation signals as discussed previously. In some embodiments, modulation/demodulation circuitry of the baseband circuitry 904 may include Fast-Fourier Transform (FFT), precoding, and/or constellation mapping/demapping functionality. In some embodiments, encoding/decoding circuitry of the baseband circuitry 904 may include convolution, tail-biting convolution, turbo, Viterbi, and/or Low Density Parity Check (LDPC) encoder/decoder functionality. Embodiments of modulation/demodulation and encoder/decoder functionality are not limited to these examples and may include other suitable functionality in other embodiments.

In some embodiments, the baseband circuitry 904 may include elements of a protocol stack such as, for example, elements of an evolved universal terrestrial radio access network (E-UTRAN) protocol including, for example, physical (PHY), media access control (MAC), radio link control (RLC), packet data convergence protocol (PDCP), and/or radio resource control (RRC) elements. A central processing unit (CPU) 904e of the baseband circuitry 904 may be configured to run elements of the protocol stack for signaling of the PHY, MAC, RLC, PDCP and/or RRC layers, and possibly TX mode selection as described herein. In some embodiments, the baseband circuitry may include one or more digital signal processor(s) (DSP) 904f for audio processing. The DSP(s) 904f may include elements for compression/decompression and echo cancellation and may include other suitable processing elements in other embodiments. The baseband circuitry 904 may further include computer-readable media 904g (also referred to as "CRM 904g", "memory 904g", or "storage 904g"). The CRM 904g may be used to load and store data and/or instructions for operations performed by the processors of the baseband circuitry 904 and to provide TX mode selection to the digital to RF circuitry 906 as shown by greyed-box as DPA modulation/mode control circuitry 904h. In other embodiments, DPA modulation/mode control circuitry is handled outside the baseband, e.g., performed by Digital to RF Conversion circuitry 906. CRM 904g for one embodiment may include any combination of suitable volatile memory and/or non-volatile memory. The CRM 904g may include any combination of various levels of memory/storage including, but not limited to, read-only memory (ROM) having embedded software instructions (e.g., firmware), random access memory (e.g., dynamic random access memory (DRAM)), cache, buffers, etc.). The CRM 904g may be shared among the various processors or dedicated to particular processors. Components of the baseband circuitry 904 may be suitably combined in a single chip, a single chipset, or disposed on a same circuit board in some embodiments. In some embodiments, some or all of the constituent components of the baseband circuitry 904 and the application circuitry 902 may be implemented together, such as, for example, on a system on a chip (SOC).

In some embodiments, the baseband circuitry 904 may provide for communication compatible with one or more radio technologies. For example, in some embodiments, the baseband circuitry 904 may support communication with an E-UTRAN, NR and/or other wireless metropolitan area networks (WMAN), a wireless local area network (WLAN), a wireless personal area network (WPAN). Embodiments in which the baseband circuitry 904 is configured to support radio communications of more than one wireless protocol may be referred to as multi-mode baseband circuitry.

Digital to RF circuitry 906 may enable communication with wireless networks using modulated electromagnetic radiation through a non-solid medium. In various embodiments, the RF circuitry 906 may include switches, filters, amplifiers, etc., to facilitate the communication with the wireless network. RF circuitry 906 may include a receive signal path that may include circuitry to down-convert RF signals received from the FEM circuitry 909 and provide digital baseband signals to the baseband circuitry 904. RF circuitry 906 may also include a transmit signal path that may include circuitry to up-convert digital baseband signals provided by the baseband circuitry 904 and provide RF output signals to the FEM circuitry 909 for transmission.

In some embodiments, the RF circuitry 906 may include a receive signal path and a transmit signal path. The receive signal path of the RF circuitry 906 may include digital concersion circuitry 906a, amplifier circuitry 906b and filter circuitry 906c. The transmit signal path of the RF circuitry 906 may include filter circuitry 906c and mixer circuitry to provide pulse modulated TX signals and extract RX pulse modulated signals from the RF carrier. RF circuitry 906 may also include synthesizer circuitry 906d for synthesizing a frequency for use by the various circuits in the receive signal path and the transmit signal path. In some embodiments, the mixer circuitry 906a of the receive signal path may be configured to down-convert the RX pulse wave signals from RF signals received from the FEM circuitry 909 based on the synthesized frequency provided by synthesizer circuitry 906d. The amplifier circuitry 906b may be configured to amplify the down-converted signals and the filter circuitry 906c may be a low-pass filter (LPF) or band-pass filter (BPF) configured to remove unwanted signals from the down-converted signals to generate output baseband signals. Output baseband signals may be provided to the baseband circuitry 904 for further processing. In some embodiments, the output baseband signals may be digital baseband signals.

In some embodiments, the mixer circuitry 906a of the transmit signal path may be configured to up-convert input baseband signals via interconnect and based on the synthesized frequency provided by the synthesizer circuitry 906d to generate RF output signals for the FEM circuitry 908. The baseband signals may be provided by the baseband circuitry 904 and may be filtered/predistorted/etc. by filter circuitry 906c. The digital filter circuitry 906c may include other filters for RF reception and transmission, although the scope of the embodiments is not limited in this respect.

In some embodiments, the digital conversion circuitry 906a of the transmit signal path may include digital to analog converters DACs and ADCs in receive signal path and the digital conversion circuitry 906a of the transmit signal path may be arranged for direct downconversion and/or direct upconversion, respectively.

In some embodiments, the output baseband signals and the input baseband signals will be digital bit streams and provide direct digital data to and from processors via interface 905 to through the interconnect, although the scope of the embodiments is not limited in this respect. In direct digital embodiments, the Digital to RF circuitry 906 may include analog-to-digital converter (ADC) and digital-to-analog converter (DAC) circuitry and the baseband circuitry 904 may include an interface 905, such as a digital baseband interface, to communicate with the RF circuitry 906.

In multi-mode embodiments, a separate radio IC circuitry may be provided for processing signals for each spectrum, although the scope of the embodiments is not limited in this respect.

In some embodiments, the synthesizer circuitry 906d may be a fractional-N synthesizer or a fractional N/N+1 synthesizer, although the scope of the embodiments is not limited in this respect, as other types of frequency synthesizers may be suitable. For example, synthesizer circuitry 906d may be a delta-sigma synthesizer, a frequency multiplier, or a synthesizer comprising a phase-locked loop with a frequency divider. The synthesizer circuitry 906d may be configured to synthesize an output frequency for use by the mixer circuitry 906a of the RF circuitry 906 based on a frequency input and a divider control input. In some embodiments, the synthesizer circuitry 906d may be a fractional N/N+1 synthesizer.

In some embodiments, frequency input may be provided by a voltage controlled oscillator (VCO), although that is not a requirement. Divider control input may be provided by either the baseband circuitry 904 or the application circuitry 902 depending on the desired output frequency. In some embodiments, a divider control input (e.g., N) may be determined from a look-up table based on a channel indicated by the application circuitry 902.

Synthesizer circuitry 906d of the RF circuitry 906 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 906d may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be a LO frequency (fLO). In some embodiments, the RF circuitry 906 may include an IQ/polar converter.

FEM circuitry 908 may include a receive signal path that may include circuitry configured to operate on RF signals received from one or more antennas 910, amplify the received signals and provide the amplified versions of the received signals to the RF circuitry 906 for further processing. In the case of a digital receiver, RF circuitry may be substantially reduced and/or combined with the FEM circuitry 908. FEM circuitry 908 may also include a transmit signal path that may include circuitry configured to amplify and modulate a digital bit stream from baseband circuitry 904 for transmission by one or more of the one or more antennas 910. In some embodiments, the FEM circuitry 908 may include a TX/RX switch to switch between transmit mode and receive mode operation. The FEM circuitry 908 may include a receive signal path and a transmit signal path. The receive signal path of the FEM circuitry may include a low-noise amplifier (LNA) to amplify received RF signals and provide the amplified received RF signals as an output (e.g., to the RF circuitry 906). The transmit (TX) signal path of the FEM circuitry 908 may include the digital power amplifier (DPA) and modulation circuits of the preferred embodiments to amplify and modulate signals a digital baseband data stream onto RF carriers including one or more filters to generate RF signals for subsequent transmission (e.g., by one or more of the one or more antennas 910). In likelihood, do to being a digital transmitter, the RF circuitry 906 will be combined with the FEM circuitry 908.

In some embodiments, the electronic device 900 may include additional elements such as, for example, a display, a camera, one or more sensors, and/or interface 905 to interconnect (for example, input/output (I/O) interfaces or buses). In embodiments where the electronic device is implemented to provide networking functions, the electronic device 900 may include network interface circuitry. The network interface circuitry may be one or more computer hardware components that connect electronic device 900 to one or more network elements, such as one or more servers within a core network via one or more wired connections. To this end, the network interface circuitry may include one or more dedicated processors and/or field programmable gate arrays (FPGAs) to communicate using one or more network communications protocols such as X2 application protocol (AP), S1 AP, Stream Control Transmission Protocol (SCTP), Ethernet, Point-to-Point (PPP), Fiber Distributed Data Interface (FDDI), and/or any other suitable network communications protocols.

EXAMPLE EMBODIMENTS

In a First Example Embodiment, a digital transmitter circuit is adapted to transmit a multi-gigabit per second data signal at millimeter wave frequencies, the digital transmitter comprising: digital power amplifier (DPA) and modulation circuitry comprising: a plurality of bit-segmented modulation driver circuits arranged in parallel and configured to modulate a digital data signal on an RF carrier to form a transmit (TX) signal in separate amplitude modulation (AM) and phase modulation (PM) paths; wherein the DPA and modulation circuity includes selectable circuits to form the transmit signal in one of a spectral shaping TX mode or a high resolution modulation TX mode.

In a Second Example embodiment a digital transmitter circuit of the First Example is furthered wherein when the selectable circuits for the spectral shaping TX mode are configured to filter out-of-band frequencies using analog pulse shaping circuitry.

In a Third Example embodiment a digital transmitter circuit of the Second Example is furthered wherein analog pulse shaping circuitry comprises a plurality of programmable current starved inverters configured as taps of a finite impulse response (FIR) filter.

In a Fourth Example embodiment a digital transmitter circuit of the First Example is furthered wherein the selectable circuits for the spectral shaping mode are configured to additionally segment each bit into sub-units, each representing a tap strength of a finite impulse response (FIR) filter to provide analog pulse shaping by increasing driver time constants to slow down pulse edges.

In a Fifth Example embodiment a digital transmitter circuit of the First Example is furthered wherein the RF carrier comprises either a single carrier or an orthogonal frequency division multiplexing (OFDM) carrier.

In a Sixth Example embodiment a digital transmitter circuit of any one of Examples embodiments 1-4 is furthered wherein each modulation and driver circuit includes power amplifier (PA) cells each comprising two differential field effect transistors (FETs) coupled at their gates to ground by a tail device and a capacitive neutralization circuit distributively coupling a source of a first FET of the PA cell to a drain of a second FET and a source of the second FET to a drain of the first FET.

In a Seventh Example embodiment a digital transmitter circuit of any one of Example embodiments 1-4 is furthered by the modulation driver circuits further comprising linear feed forward equalizers to either predistort a TX data signal in a time domain for modulating a single carrier (SC) or predistort inverse fast Fourier transform (IFFT) block sets in a frequency domain for modulating an orthogonal frequency division multiplexing (OFDM) carrier.

In an Eighth Example embodiment, a device is disclosed for a transmitter having digital transmit (TX) circuitry to transmit a multi-gigabit per second data signal at millimeter wave frequencies, the device comprising a memory storing machine executable instructions; and a processing circuit including at least one processor to retrieve and execute the machine executable instructions and cause the one or more processors to: identify a mode of transmission to transmit between a spectral shaping TX mode or high resolution TX mode; and signal the transmitter and cause the digital TX circuitry to: amplify and modulate a digital data signal on an RF carrier to form a transmit signal using a plurality of separate and parallel bit-segmented amplitude modulation (AM) and phase modulation (PM) reconfigurable driver circuits; and select a configuration of the reconfigurable driver circuits to form the transmit signal based on the identified mode of transmission.

In a Ninth Example embodiment, the device of the Eighth Example is furthered wherein the reconfigurable driver circuits for the spectral shaping mode are configured to filter out-of-band frequencies using analog pulse shaping circuitry.

In a Tenth Example embodiment, the device of the Ninth Example is furthered by the analog pulse shaping circuitry comprising a number of phase shifted sub-bit branches, each branch providing a sub-bit having a different phase to a programmable current starved inverter and configured as taps of a finite impulse response (FIR) filter.

In an Eleventh Example embodiment, the device of the Eighth Example is furthered by the reconfigurable driver circuits for the spectral shaping mode providing analog pulse shaping by increasing resistor-capacitor (RC) circuit time constants in select driver circuits to slow down pulse edges and filter out of band (OOB) frequencies.

In a Twelfth Example embodiment, the device of the Eighth Example is furthered by the RF carrier comprising either a single carrier or an orthogonal frequency division multiplexing (OFDM) carrier.

In a Thirteenth Example embodiment, the device of any one of Examples 8-12 is furthered by each reconfigurable driver circuit includes a power amplifier (PA) cell comprising differential PA devices coupled to a tail switching device and a distributed capacitive neutralization circuit and wherein the memory includes further machine readable instructions to cause the one or more processors to signal bits to the tail switching device.

In a Fourteenth Example embodiment, the device of any one of Examples 8-12 is furthered by the reconfigurable driver circuits including linear feed forward equalizers (FFEs) to predistort TX data signals in a time domain for modulating a single carrier (SC) or predistort inverse fast Fourier transform blocks in a frequency domain for modulating an orthogonal frequency division multiplexing (OFDM) carrier to further reduce of out of band frequencies and limit error vector magnitude (EVM).

A user equipment (UE) according to a Fifteenth Example embodiment, a digital transmitter includes transmit circuitry configured to transmit a multi-gigabit per second data signal modulated on an RF carrier at millimeter wave frequencies and reconfigurable to form a TX signal in either one of a high-resolution modulation TX mode and a spectral shaping TX mode; and a transmit mode control circuit communicatively coupled with the digital transmitter and configured to signal the digital transmitter to select which transmit mode to use; wherein the transmit circuitry comprises a number of digital power amplifier (DPA) and modulation reconfigurable circuit segments to process the data signal on a per bit basis in parallel, to form the TX signal according to the selected TX mode.

According to a Sixteenth Example embodiment, the UE of the Fifteenth Example is furthered by the reconfigurable circuit segments including analog pulse shaping circuitry to process the data signal in the spectral shaping TX mode.

According to a Seventeenth Example embodiment, the device of the Sixteenth Example is furthered by the analog pulse shaping circuitry comprising a plurality of programmable current starved inverters serving as tap strengths of a finite impulse response (FIR) filter.

According to an Eighteenth Example, the UE of the Fifteenth Example is furthered by the reconfigurable circuit segments in the spectral shaping TX mode being configured to suppress out-of-band frequencies by slowing down pulse edges.

According to a Nineteenth Example embodiment, the UE of the Fifteenth Example is furthered by the RF carrier comprising either a single carrier or an orthogonal frequency division multiplexing (OFDM) carrier.

In a Twentieth Example embodiment, the Fifteenth through Nineteenth Examples may be furthered by each reconfigurable circuit segment comprising a power amplifier (PA) cell comprising differential PA devices coupled to a tail switching device and a distributed capacitive neutralization circuit.

In a Twenty-First Example embodiment, the Fifteenth through Nineteenth Examples may be furthered by the reconfigurable circuit segments being configured to predistort a TX data signal in a time domain for modulating a single carrier (SC) or predistort inverse fast Fourier transform (IFFT) block sets in a frequency domain for modulating an orthogonal frequency division multiplexing (OFDM) carrier.

In a Twenty-Second Example embodiment, the Fifteenth through Nineteenth Examples may be furthered by the digital transmitter further includes digital to analog (DAC) circuitry to provide a data bit stream to the transmit circuitry.

In a Twenty-Third Example embodiment, the Fifteenth through Nineteenth Examples may be furthered by the reconfigurable circuit segments further comprising a plurality of multiplexers to enable switching between finite impulse response (FIR) circuitry used in the spectral shaping TX mode and bypassing FIR circuitry not used in the high-resolution modulation mode.

The invention claimed is:

1. A digital transmitter circuit adapted to transmit a multi-gigabit per second data signal at millimeter wave frequencies, the digital transmitter comprising:
digital power amplifier (DPA) and modulation circuitry comprising:
a plurality of bit-segmented modulation driver circuits arranged in parallel and configured to modulate a digital data signal on an RF carrier to form a transmit (TX) signal in separate amplitude modulation (AM) and phase modulation (PM) paths, the DPA and modulation circuitry containing selectable circuits to form the transmit signal in one of a spectral shaping TX mode or a high resolution modulation TX mode.

2. The digital transmitter circuit of claim 1 wherein when the selectable circuits for the spectral shaping TX mode are configured to filter out-of-band frequencies using analog pulse shaping circuitry.

3. The digital transmitter circuit of claim 2 wherein analog pulse shaping circuitry comprises a plurality of programmable current starved inverters configured as taps of a finite impulse response (FIR) filter.

4. The digital transmitter circuit of claim 1 wherein the selectable circuits for the spectral shaping mode are configured to additionally segment each bit into sub-units and delay their phase to provide analog pulse shaping by increasing a bit driver time constants to slow down pulse edges.

5. The digital transmitter circuit of claim 1 wherein the RF carrier comprises either a single carrier or an orthogonal frequency division multiplexing (OFDM) carrier.

6. The digital transmitter circuit of claim 1 wherein each modulation and driver circuit includes power amplifier (PA) cells each comprising two differential field effect transistors (FETs) coupled at their gates to ground by a tail device and a capacitive neutralization circuit distributively coupling a source of a first FET of the PA cell to a drain of a second FET and a source of the second FET to a drain of the first FET.

7. The digital transmitter circuit of claim 1 wherein the modulation driver circuits further comprise linear feed forward equalizers to either predistort a TX data signal in a time domain for modulating a single carrier (SC) or predistort inverse fast Fourier transform (IFFT) block sets in a frequency domain for modulating an orthogonal frequency division multiplexing (OFDM) carrier.

8. A device for a transmitter having digital transmit (TX) circuitry to transmit a multi-gigabit per second data signal at millimeter wave frequencies, the device comprising a memory storing machine executable instructions; and
a processing circuit including at least one processor to retrieve and execute the machine executable instructions and cause the at least one processor to:
identify a mode of transmission to transmit between a spectral shaping TX mode or high resolution TX mode; and
signal the transmitter and cause the digital TX circuitry to:
amplify and modulate a digital data signal on an RF carrier to form a transmit signal using a plurality of separate and parallel bit-segmented amplitude modulation (AM) and phase modulation (PM) reconfigurable driver circuits; and select a configuration of the reconfigurable driver circuits to form the transmit signal based on the identified mode of transmission.

9. The device of claim 8 wherein the reconfigurable driver circuits for the spectral shaping mode are configured to filter out-of-band frequencies using analog pulse shaping circuitry.

10. The device of claim 9 wherein the analog pulse shaping circuitry comprises a number of phase shifted sub-bit branches, each branch providing a sub-bit having a different phase to a programmable current starved inverter and configured as taps of a finite impulse response (FIR) filter.

11. The device of claim 8 wherein the reconfigurable driver circuits for the spectral shaping mode provide analog pulse shaping by increasing resistor-capacitor (RC) circuit time constants in select driver circuits to slow down pulse edges and filter out of band (OOB) frequencies.

12. The device of claim 8 wherein the RF carrier comprises either a single carrier or an orthogonal frequency division multiplexing (OFDM) carrier.

13. The device of claim 8 wherein each reconfigurable driver circuit includes a power amplifier (PA) cell comprising differential PA devices coupled to a tail switching device and a distributed capacitive neutralization circuit and wherein the memory includes further machine readable instructions to cause the one or more processors to signal bits to the tail switching device.

14. The device of claim 8 wherein the reconfigurable driver circuits include linear feed forward equalizers (FFEs) to predistort TX data signals in a time domain for modulating a single carrier (SC) or predistort inverse fast Fourier transform blocks in a frequency domain for modulating an orthogonal frequency division multiplexing (OFDM) carrier to further reduce of out of band frequencies and limit error vector magnitude (EVM).

15. A user equipment (UE) comprising:

a digital transmitter including transmit circuitry configured to transmit a multi-gigabit per second data signal modulated on an RF carrier at millimeter wave frequencies and reconfigurable to form a transmit (TX) signal in either one of a high-resolution modulation TX mode and a spectral shaping TX mode; and a transmit mode control circuit communicatively coupled with the digital transmitter and configured to signal the digital transmitter to select which TX mode to use, the transmit circuitry comprising a number of digital power amplifier (DPA) and modulation reconfigurable circuit segments to process the data signal on a per bit basis in parallel, to form the TX signal according to the selected TX mode.

16. The UE of claim 15 wherein the reconfigurable circuit segments include analog pulse shaping circuitry to process the data signal in the spectral shaping TX mode.

17. The UE of claim 16 wherein the analog pulse shaping circuitry comprises a plurality of programmable current starved inverters serving as tap strengths of a finite impulse response (FIR) filter.

18. The UE of claim 17 wherein the reconfigurable circuit segments in the spectral shaping TX mode are configured to suppress out-of-band frequencies by slowing down pulse edges.

19. The UE of claim 15 wherein the RF carrier comprises either a single carrier or an orthogonal frequency division multiplexing (OFDM) carrier.

20. The UE of claim 15 wherein at least one of:

each reconfigurable circuit segment comprises a power amplifier (PA) cell comprising differential PA devices coupled to a tail switching device and a distributed capacitive neutralization circuit, the reconfigurable circuit segments are configured to predistort a TX data signal in a time domain for modulating a single carrier (SC) or predistort inverse fast Fourier transform (IFFT) block sets in a frequency domain for modulating an orthogonal frequency division multiplexing (OFDM) carrier, the digital transmitter further includes digital to analog circuitry to provide a data bit stream to the transmit circuitry, or the reconfigurable circuit segments further comprise a plurality of multiplexers to enable switching between finite impulse response (FIR) circuitry used in the spectral shaping TX mode and bypassing FIR circuitry not used in the high-resolution modulation mode.

* * * * *